(12) United States Patent
Cheng et al.

(10) Patent No.: US 12,176,387 B2
(45) Date of Patent: Dec. 24, 2024

(54) TRENCH CAPACITOR PROFILE TO DECREASE SUBSTRATE WARPAGE

(71) Applicant: Taiwan Semiconductor Manufacturing Company, Ltd., Hsin-Chu (TW)

(72) Inventors: Hsin-Li Cheng, Hsin Chu (TW); Jyun-Ying Lin, Wujie Township (TW); Alexander Kalnitsky, San Francisco, CA (US); Shih-Fen Huang, Jhubei (TW); Shu-Hui Su, Tucheng (TW); Ting-Chen Hsu, Taichung (TW); Tuo-Hsin Chien, Zhubei (TW); Felix Ying-Kit Tsui, Cupertino, CA (US); Shi-Min Wu, Changhua County (TW); Yu-Chi Chang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/362,146

(22) Filed: Jul. 31, 2023

(65) Prior Publication Data
US 2023/0378251 A1 Nov. 23, 2023

Related U.S. Application Data

(63) Continuation of application No. 17/370,067, filed on Jul. 8, 2021, now Pat. No. 11,769,792, which is a
(Continued)

(51) Int. Cl.
*H01L 29/94* (2006.01)
*H01L 21/02* (2006.01)
(Continued)

(52) U.S. Cl.
CPC ........ *H01L 28/91* (2013.01); *H01L 21/02164* (2013.01); *H01L 21/02236* (2013.01);
(Continued)

(58) Field of Classification Search
None
See application file for complete search history.

(56) References Cited

U.S. PATENT DOCUMENTS 4,882,649 A * 11/1989 Chen ........................ H01G 4/20
29/25.42
4,918,503 A * 4/1990 Okuyama .............. H10B 12/37
257/E27.092
(Continued)

FOREIGN PATENT DOCUMENTS

DE 10128326 C1 2/2003
DE 102013100025 A1 7/2013
(Continued)

OTHER PUBLICATIONS

Machine Translation, WO 2019/239804 A1, Nakagawa et al., Dec. 19, 2019 (Year: 2019).*
(Continued)

*Primary Examiner* — Scott B Geyer
(74) *Attorney, Agent, or Firm* — Eschweiler & Potashnik, LLC

(57) ABSTRACT

Various embodiments of the present disclosure are directed towards an integrated chip including a capacitor over a substrate. The capacitor includes a plurality of conductive layers and a plurality of dielectric layers. The plurality of conductive layers and dielectric layers define a base structure and a first protrusion structure extending downward from the base structure towards a bottom surface of the substrate. The first protrusion structure comprises one or
(Continued)

more surfaces defining a first cavity. A top of the first cavity is disposed below the base structure.

20 Claims, 14 Drawing Sheets

Related U.S. Application Data continuation of application No. 16/728,452, filed on Dec. 27, 2019, now Pat. No. 11,063,157.

(51) Int. Cl.
*H01L 21/3213* (2006.01)
*H01L 21/764* (2006.01)
*H01L 23/00* (2006.01)
*H01L 29/66* (2006.01)
*H01L 49/02* (2006.01)

(52) U.S. Cl.
CPC ...... *H01L 21/32139* (2013.01); *H01L 21/764* (2013.01); *H01L 23/562* (2013.01); *H01L 28/92* (2013.01); *H01L 29/66181* (2013.01); *H01L 29/945* (2013.01)

(56) References Cited

U.S. PATENT DOCUMENTS

| | | | |
|---|---|---|---|
| 5,895,255 A | 4/1999 | Tsuchiaki | |
| 5,937,296 A | 8/1999 | Arnold | |
| 6,103,585 A | 8/2000 | Michaelis et al. | |
| 6,258,689 B1 | 7/2001 | Bronner et al. | |
| 6,297,527 B1 | 10/2001 | Agarwal et al. | |
| 6,437,385 B1 | 8/2002 | Bertin et al. | |
| 8,487,405 B2* | 7/2013 | Tian | H01L 29/945 257/532 |
| 10,276,651 B2 | 4/2019 | Lin et al. | |
| 2001/0023956 A1 | 9/2001 | Collins et al. | |
| 2002/0182819 A1 | 12/2002 | Schrems et al. | |
| 2002/0187605 A1* | 12/2002 | Gutsche | H01L 29/945 438/389 |
| 2003/0143322 A1 | 7/2003 | Ning | |
| 2004/0036051 A1 | 2/2004 | Sneh | |
| 2004/0036102 A1 | 2/2004 | Sell et al. | |
| 2004/0106254 A1* | 6/2004 | Furuhata | H01L 21/76877 438/386 |
| 2004/0175884 A1 | 9/2004 | Kang et al. | |
| 2004/0245558 A1 | 12/2004 | Manger | |
| 2005/0079679 A1 | 4/2005 | Seidl et al. | |
| 2005/0118762 A1* | 6/2005 | Nakamura | H01L 28/65 257/E21.311 |
| 2006/0172489 A1 | 8/2006 | Seidl et al. | |
| 2007/0096253 A1* | 5/2007 | Torres | H01L 27/0805 257/532 |
| 2007/0232011 A1 | 10/2007 | Gogoi et al. | |
| 2008/0211002 A1 | 9/2008 | Nakamura et al. | |
| 2008/0291601 A1* | 11/2008 | Roozeboom | H01L 29/945 257/E27.048 |
| 2009/0096001 A1 | 4/2009 | Ludwig et al. | |
| 2009/0101956 A1 | 4/2009 | Booth, Jr. et al. | |
| 2009/0250738 A1 | 10/2009 | Dyer | |
| 2010/0062579 A1 | 3/2010 | Juenling et al. | |
| 2010/0213571 A1 | 8/2010 | Dyer et al. | |
| 2012/0127625 A1* | 5/2012 | Wang | H01L 28/87 361/301.1 |
| 2012/0139080 A1 | 6/2012 | Wang et al. | |
| 2012/0199949 A1 | 8/2012 | Lan et al. | |
| 2012/0211865 A1* | 8/2012 | Tian | H01L 27/0805 257/532 |
| 2013/0056850 A1 | 3/2013 | Kume et al. | |
| 2013/0062677 A1* | 3/2013 | Li | H01L 27/1203 438/389 |
| 2013/0175666 A1* | 7/2013 | Tran | H01L 28/40 257/532 |
| 2013/0183805 A1 | 7/2013 | Wong et al. | |
| 2014/0070293 A1 | 3/2014 | Li et al. | |
| 2015/0044853 A1 | 2/2015 | Chudzik et al. | |
| 2015/0162278 A1 | 6/2015 | Zhang et al. | |
| 2015/0171088 A1 | 6/2015 | Hung et al. | |
| 2016/0020267 A1 | 1/2016 | Lin | |
| 2017/0186837 A1 | 6/2017 | Yen et al. | |
| 2018/0047807 A1 | 2/2018 | Ho et al. | |
| 2018/0203314 A1 | 7/2018 | Sugimoto | |
| 2018/0342352 A1 | 11/2018 | Park et al. | |
| 2019/0074349 A1 | 3/2019 | Lin et al. | |
| 2019/0245031 A1 | 8/2019 | Lin et al. | |
| 2019/0296147 A1 | 9/2019 | Kawamura | |
| 2020/0005999 A1 | 1/2020 | Masuda et al. | |
| 2020/0066922 A1 | 2/2020 | Cheng et al. | |
| 2020/0176552 A1 | 6/2020 | Chang et al. | |
| 2021/0027950 A1* | 1/2021 | Nakagawa | H01G 4/018 |
| 2021/0057469 A1 | 2/2021 | Huang | |

FOREIGN PATENT DOCUMENTS

| | | | |
|---|---|---|---|
| JP | 2019029537 A | 2/2019 | |
| WO | WO-2019239804 A1 * | 12/2019 | G11B 5/41 |

OTHER PUBLICATIONS

Notice of Allowance dated Mar. 10, 2021 for U.S. Appl. No. 16/728,452.
Non-Final Office Action dated Feb. 8, 2023 for U.S. Appl. No. 17/370,067.
Notice of Allowance dated May 25, 2023 for U.S. Appl. No. 17/370,067.

* cited by examiner

TRENCH CAPACITOR PROFILE TO DECREASE SUBSTRATE WARPAGE

REFERENCE TO RELATED APPLICATIONS

This Application is a Continuation of U.S. application Ser. No. 17/370,067, filed on Jul. 8, 2021, which is a Continuation of U.S. application Ser. No. 16/728,452, filed on Dec. 27, 2019 (now U.S. Pat. No. 11,063,157, issued on Jul. 13, 2021). The contents of the above-referenced patent applications are hereby incorporated by reference in their entirety.

BACKGROUND

A trench capacitor exhibits high power density relative to some other capacitor types within a semiconductor integrated circuit (IC). As such, trench capacitors are utilized in applications such as dynamic random-access memory (DRAM) storage cells, among other applications. Some examples of trench capacitors include high density deep trench capacitors (DTCs) which are utilized in advanced technology node processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
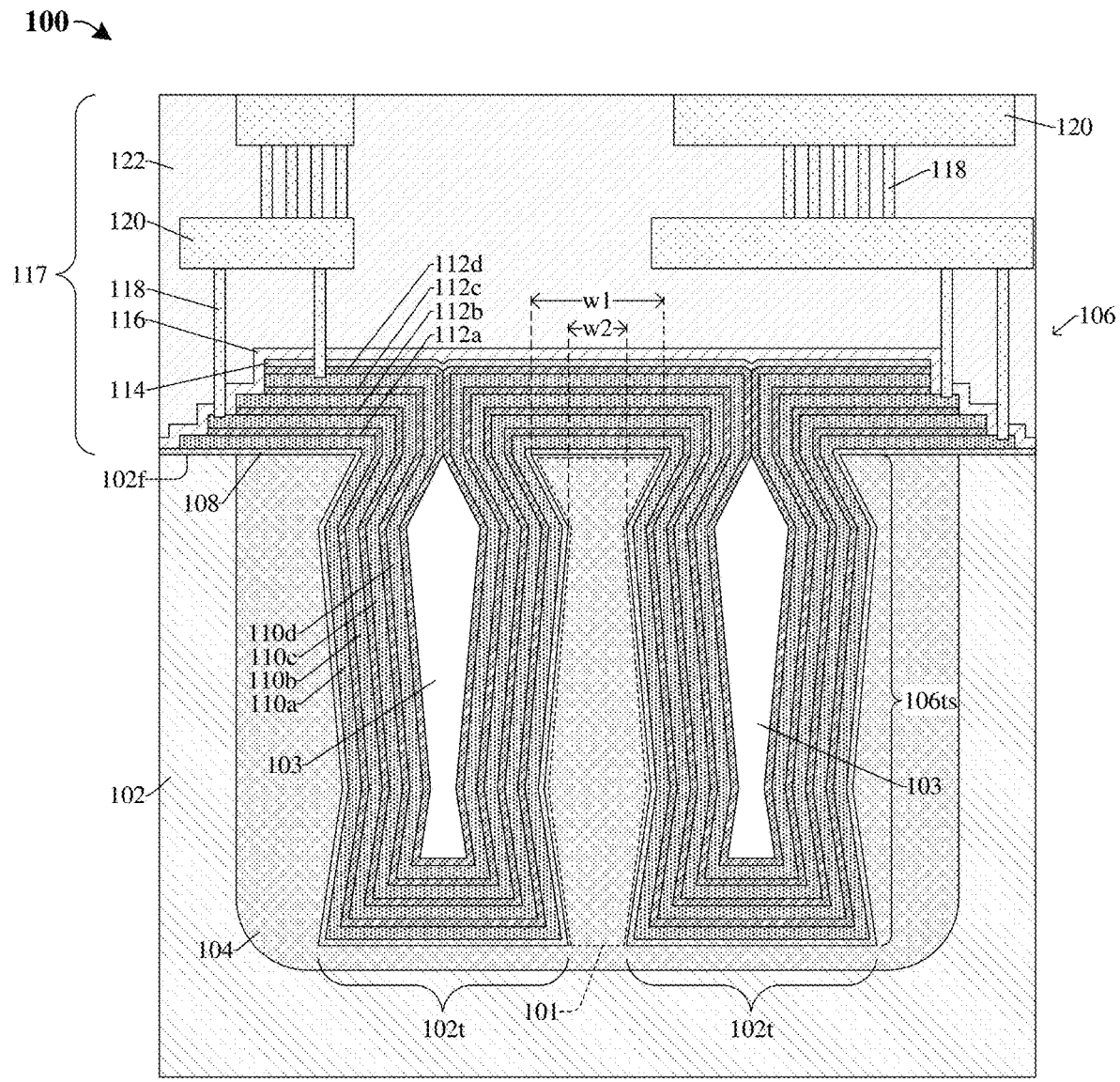
FIG. 1 illustrates a cross-sectional view of some embodiments of an integrated circuit (IC) including a trench capacitor disposed within a trench and laterally adjacent to a cavity within the trench.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuits may include a number of semiconductor devices such as a trench capacitor disposed within and/or over a semiconductor substrate. For example, the substrate may include sidewalls that define a plurality of trenches. The semiconductor substrate further comprises a plurality of substrate pillars such that a substrate pillar laterally separates adjacent trenches from one another. The trench capacitor includes multiple electrodes and one or more dielectric layers, where the multiple electrodes and the dielectric layer(s) are alternatingly stacked in the plurality of trenches. Each electrode continuously extends across each trench in the plurality of trenches and continuously extends along sidewalls of the substrate pillars. A capacitance density of the trench capacitor may be increased by increasing the number of trenches disposed within the substrate. This is because a surface area between adjacent electrodes is increased as the number of trenches increases.

A challenge with the trench capacitor is a physical stress in the semiconductor substrate as the number of trenches increases. For example, during fabrication of the trench capacitor, an etch process is performed into the semiconductor substrate to define the plurality of substrate pillars and the plurality of trenches. The etch process is configured such that the substrate pillars respectively comprise substantially straight opposing sidewalls. Deposition processes are performed to define the plurality of electrodes and dielectric layers within the trenches such that the electrodes and dielectric layers completely fill each trench. This, in part, is because the electrodes and dielectric layers conform to the substantially straight opposing sidewalls of the substrate pillars. However, during the fabrication process and/or during operation of the trench capacitor, the electrodes and dielectric layers are exposed to heat (e.g., due to baking process(es) and/or heat generated by high voltages and/or currents). The heat causes the dielectric layers and/or the electrodes to undergo thermal expansion. Because the trenches are completely filled, the expansion of the aforementioned layers applies force against surfaces of the substrate defining the trenches. This may lead to warping, breaking, and/or cracking of the semiconductor substrate, thereby resulting in device failure. As the trench densities increase (e.g., due to smaller process nodes), the foregoing issues are expected to become more prominent.

Accordingly, various embodiments of the present disclosure are directed towards a trench capacitor with a high capacitance density and low substrate warpage, and an associated method for forming the trench capacitor. For example, a method for forming the trench capacitor includes performing an etch process into a front-side surface of a semiconductor substrate to define a plurality of substrate pillars and a plurality of trenches. The etch process is configured such that a width of each substrate pillar continuously decreases from the front-side surface of the semiconductor substrate to a first point below the front-side surface. Further, the width of each substrate pillar may continuously increase from the first point to a second point that is vertically below the first point. Subsequently, a plurality of deposition processes (e.g., atomic layer deposition (ALD) processes) are preformed to define a plurality of electrodes and dielectric layers along sidewalls of the substrate pillar structures and within the plurality of trenches. By virtue of the profile of the substrate pillars, a cavity may be present within each trench after performing the plurality of deposition processes. This is because the electrodes and dielectric layers conform to the sidewalls of the substrate pillars. The presence of the void within each trench provides space for the electrodes and dielectric layers to expand when exposed to heat. This mitigates force applied to the semiconductor substrate as the aforementioned layers undergo thermal expansion, thereby decreasing warping, breaking, and/or cracking of the semiconductor substrate.

FIG. 1 illustrates a cross-sectional view of some embodiments of an integrated circuit (IC) 100 having a trench capacitor 106 disposed within a semiconductor substrate 102.

In some embodiments, the IC 100 has an interconnect structure 117 overlying the semiconductor substrate 102. The semiconductor substrate 102 comprises a doped region 104. In some embodiments, the doped region 104 may, for example, be or comprising a first doping type (e.g., p-type). A trench capacitor 106 overlies the semiconductor substrate 102 and has trench segments 106ts that fill trenches 102t defined by sidewalls of the semiconductor substrate 102. The trench segments 106ts may be deposited within the doped region 104, such that the doped region 104 is configured to electrically isolate the trench capacitor 106 from other devices disposed within and/or on the semiconductor substrate 102. The semiconductor substrate 102 comprises a pillar structure 101 that is defined laterally between the trench segments 106ts of the trench capacitor 106. An insulator layer 108 extends along a front-side surface 102f of the semiconductor substrate 102 and along sidewalls of the semiconductor substrate 102 that define the trenches 102t and the pillar structure 101.

In some embodiments, the interconnect structure 117 includes a plurality of conductive vias 118 and a plurality of conductive wires 120 disposed within an interconnect dielectric structure 122. The conductive vias 118 and the conductive wires 120 are configured to electrically couple semiconductor devices disposed within the IC 100 together. Further, an etch stop layer 116 is disposed along an upper surface of the trench capacitor 106. A capping dielectric layer 114 is disposed between the trench capacitor 106 and the etch stop layer 116.

In some embodiments, the trench capacitor 106 comprises a plurality of capacitor electrode layers 110a-d and a plurality of capacitor dielectric layers 112a-d alternatingly disposed between the capacitor electrode layers 110a-d. In some embodiments, the capacitor electrode layers 110a, 110c are directly electrically coupled together by an overlying conductive wire 120 and conductive vias 118, thereby defining a first capacitor electrode. In further embodiments, the capacitor electrode layers 110b, 110d are directly electrically coupled together by an overlying conductive wire 120 and conductive vias 118, thereby defining a second capacitor electrode. By virtue of the first and second electrodes respectively having more than one capacitor electrode layers, a capacitance density of the trench capacitor 106 may be increased. For example, the capacitance (C) (in farads) of the trench capacitor 106 is defined as: $C = \varepsilon_r \varepsilon_0 A / d$, where A is the area of overlap between the first and second electrodes; $\varepsilon_r$ is the relative static permittivity of the capacitor dielectric layers 112a-d between the first and second electrodes; Co is the electric constant ($\varepsilon_0 \approx 8.854 \times 10^{-12}$ F m$^{-1}$); and d is the distance separating the first and second electrodes. Therefore, in some embodiments, by increasing the area (A) of overlap between the first and second electrodes, the capacitance (C) of the trench capacitor 106 may be increased. In further embodiments, to increase the area (A) of overlap between the first and second electrodes, a number of trench segments 106t may be increased.

In some embodiments, the pillar structure 101 has a first width w1 that is aligned with the front-side surface 102f of the semiconductor substrate 102, and further has a second width w2 that is disposed vertically at a first point beneath the front-side surface 102f. The first width w1 is greater than the second width w2. In further embodiments, a width of the pillar structure 101 continuously decreases from the front-side surface 102f of the semiconductor substrate 102 to the first point. This, in part, ensures that a cavity 103 will exist in each of the trenches 102t. For example, during fabrication of the trench capacitor 106, the capacitor electrode layers 110a-d and the capacitor dielectric layers 112a-d are deposited (e.g., by one or more ALD processes) such that they will conform to a shape of the pillar structure 101. Because the first width w1 of the pillar structure 101 is greater than the second width w2 of the pillar structure 101, the cavity 103 will be present in each trench 102t after depositing the capacitor electrode layers 110a-d and the capacitor dielectric layers 112a-d.

In some embodiments, during operation and/or fabrication of the IC 100, the layers of the trench capacitor 106 are exposed to high heat. The high heat results in thermal expansion of the capacitor electrode layers 110a-d and capacitor dielectric layers 112a-d such that the aforementioned layers may expand into the cavity 103. This, in part, mitigates force applied to the semiconductor substrate 102 as the capacitor electrode layers 110a-d and the capacitor dielectric layers 112a-d expand. For example, in various embodiments, the capacitor electrode layers 110a-d and the capacitor dielectric layers 112a-d completely fill each trench 102t such that the cavity 103 is omitted (not shown). In such embodiments, expansion of the layers of the trench capacitor 106 applies force to surfaces of the semiconductor substrate 102 that may result in warpage and/or cracking of the semiconductor substrate 102. Therefore, in some embodiments according to the present disclosure, by virtue of the profile of the pillar structure 101, the capacitor electrode layers 110a-d and capacitor dielectric layers 112a-d may be formed in such a manner that a cavity 103 is present in each trench 102t. The capacitor electrode layers 110a-d and capacitor dielectric layers 112a-d may expand into the cavity 103 while undergoing thermal expansion, thereby mitigating warpage, cracking, and/or breaking of the semiconductor substrate 102. This, in part, increases a number of trenches 102t that may be formed within the semiconductor substrate 102, thereby increasing a capacitor density of the trench capacitor 106 while decreasing substrate warpage.

In some embodiments, the first width w1 of the pillar structure 101 is within a range of about 0.1 to 0.2 micrometers. In further embodiments, if the first width w1 is less than about 0.1 micrometers, then the pillar structure 101 is too thin such that it may collapse due to force applied by layers of the trench capacitor 106. In yet further embodiments, if the first width w1 is greater than about 0.2 micrometers, then a number of trenches 102t that may be formed within the semiconductor substrate 102 is reduced and/or an opening of each trench 102t is too small to facilitate proper deposition of layers of the trench capacitor 106 within the trenches 102t. In various embodiments, the second width w2 of the pillar structure 101 is within a range of about 0.07 to 0.17 micrometers. In further embodiments, if the second width w2 is less than about 0.07 micrometers, then the pillar structure 101 is too thin such that it may collapse due to force applied by layers of the trench capacitor 106. In yet further embodiments, if the second width w2 is greater than about 0.17 micrometers, then a size of the cavity 103 may be reduced. In such embodiments, reduction of the size of the cavity 103 increases a stress applied to the semiconductor substrate 102 as the capacitor electrode layers 110a-d and capacitor dielectric layers 112a-d expand, thereby resulting in warpage and/or cracking of the semiconductor substrate 102. In various embodiments, the first width w1 is greater than the second width w2. In further embodiments, a difference between the first width w1 and the second width w2 (e.g., w1−w2) is greater than about 30 nanometers. In some embodiments, if the difference between the first width w1 and the second width w2 is less than about 30 nanometers, then the size of the cavity 103 may be reduced, thereby resulting in warpage and/or cracking of the semiconductor substrate 102.

Figure 2:
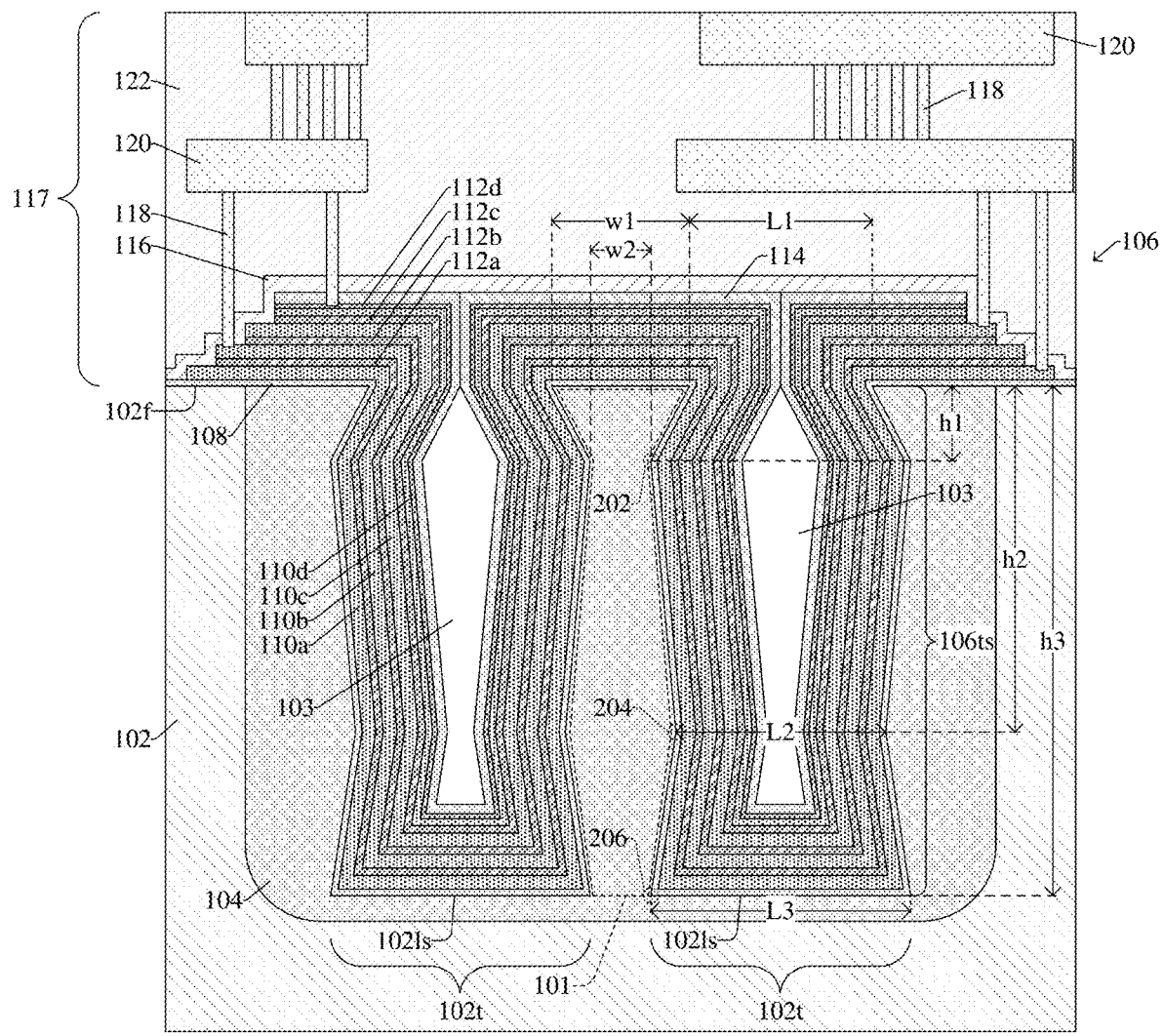
FIGS. 2-4 illustrate cross-sectional views of some alternative embodiments of the IC of FIG. 1.

FIG. 2 illustrates some embodiments of a cross-sectional view of an integrated circuit (IC) 200 according to some alternative embodiments of the IC 100 of FIG. 1.

The IC 200 includes an interconnect structure 117 overlying a front-side surface 102f of a semiconductor substrate 102. In some embodiments, the semiconductor substrate 102 may, for example, be or comprise a bulk substrate (e.g., bulk silicon), a silicon-on-insulator (SOI) substrate, or another suitable substrate and/or may comprise a first doping type (e.g., p-type). A doped region 104 is disposed within the semiconductor substrate 102 and may comprise the first doping type with a higher doping concentration than the semiconductor substrate 102. The interconnect structure 117 includes an interconnect dielectric structure 122, a plurality of conductive vias 118, and a plurality of conductive wires 120. The interconnect dielectric structure 122 may, for example, include one or more inter-level dielectric (ILD) layers. The one or more ILD layers may, for example, respectively be or comprise an oxide, such as silicon dioxide, a low-k dielectric material, an extreme low-k dielectric material, any combination of the foregoing, or another suitable dielectric material. The plurality of conductive vias and wires 118, 120 are configured to electrically couple semiconductor devices disposed over and/or within the semiconductor substrate 102 to one another. In further embodiments, the conductive vias and wires 118, 120 may, for example, respectively be or comprise tungsten, copper, aluminum, titanium nitride, tantalum nitride, any combination of the foregoing, or the like.

The semiconductor substrate 102 comprises sidewalls that define one or more trenches 102t. The trenches 102t extend continuously from a front-side surface 102f of the semiconductor substrate 102 to a point below the front-side surface 102f. In further embodiments, a trench capacitor 106 is disposed over the front-side surface 102f and at least partially fills the trenches 102t. In some embodiments, the trench capacitor 106 comprises a plurality of capacitor electrode layers 110a-d and a plurality of capacitor dielectric layers 112a-d. An insulator layer 108 is disposed between the semiconductor substrate 102 and a first capacitor electrode layer 110a, such that the insulator layer 108 may electrically isolate the trench capacitor from the semiconductor substrate 102 and/or devices disposed within/over the semiconductor substrate 102. In some embodiments, the insulator layer 108 may, for example, be or comprise an oxide, such as silicon dioxide, or another suitable dielectric material. In some embodiments, the capacitor dielectric layers 112a-d are alternatingly stacked between the capacitor electrode layers 110a-d, such that adjacent capacitor electrode layers 110a-d are separated from one another by one of the capacitor dielectric layers 112a-d. In further embodiments, a thickness of each of the capacitor dielectric layers 112a-d is greater than a thickness of each of the capacitor electrode layers 110a-d. In some embodiments, the capacitor electrode layers 110a-d may, for example, respectively be or comprise titanium nitride, tantalum nitride, or the like. In further embodiments, the capacitor dielectric layers 112a-d may, for example, respectively be or comprise a high-k dielectric material, or some other suitable dielectric material(s). The high-k dielectric material may, for example, be or comprise hafnium oxide, zirconium oxide, aluminum oxide, tantalum oxide, titanium oxide, or some other suitable high-k dielectric material(s), or any combination of the foregoing. In yet further embodiments, the capacitor electrode layers 110a-d and/or the capacitor dielectric layers 112a-d may respectively extend along the front-side surface 102f into the trenches 102t such that the aforementioned layers line each trench 102t.

The trench capacitor 106 has trench segments 106ts that fill a corresponding trench 102t. The trench segments 106ts of the trench capacitor 106 conform to sidewalls of the semiconductor substrate 102 that define the pillar structure 101. In further embodiments, a capping dielectric layer 114 continuously extends along an upper surface of an uppermost capacitor dielectric layer 112d. The capping dielectric layer 114 may, for example, be configured to seal each cavity 103 within a corresponding trench 102t to a first gas pressure such that the cavity 103 is defined between inner sidewalls of the capping dielectric layer 114. In some embodiments, the capping dielectric layer 114 may, for example, be or comprise an oxide, such as silicon dioxide, silicon oxynitride, silicon oxycarbide, or another suitable dielectric material. In further embodiments, an etch stop layer 116 is disposed along an upper surface of the trench capacitor 106. In some embodiments, the etch stop layer 116 may, for example, be or comprise silicon nitride, silicon carbide, silicon oxynitride, silicon oxycarbide, any combination of the foregoing, or another suitable dielectric material.

The pillar structure 101 has a first width w1 that is horizontally aligned with the front-side surface 102f of the semiconductor substrate 102, and further has a second width w2 that is disposed at a first point 202 vertically offset from the front-side surface 102f. In some embodiments, the first width w1 is greater than the second width w2. Further, the width of the pillar structure 101 may continuously decrease from the front-side surface 102f of the semiconductor substrate 102 to the first point 202. In further embodiments, a first height h1 of the pillar structure 101 is defined from the front-side surface 102f of the semiconductor substrate 102 to the first point 202. In yet further embodiments, the first height h1 is, for example, greater than 0.05 micrometers or within a range of about 0.05 to 4 micrometers. In further embodiments, if, for example, the first height h1 is less than 0.05 micrometers, then a size of the cavity 103 may be reduced which may increase an amount of stress induced on the semiconductor substrate 102. In yet further embodiments, the width of the pillar structure 101 continuously decreases across the first height h1 in a direction away from the front-side surface 102f of the semiconductor substrate 102. In some embodiments, the first width w1 of the pillar structure 101 is within a range of about 0.1 to 0.2 micrometers. In various embodiments, the second width w2 of the pillar structure 101 is within a range of about 0.07 to 0.17 micrometers. In some embodiments, a first length L1 of the trench 102t is within a range of about 0.3 to 0.4 micrometers. The first length L1 is aligned with the front-side surface 102f of the semiconductor substrate 102 and may define an opening of the trench 102t. In some embodiments, if the first length L1 is less than about 0.3 micrometers, then an opening of the trench 102t is too small such that layers of the trench capacitor 106 may not properly be deposited within the trench 102t. In further embodiments, if the first length L1 is greater than about 0.4 micrometers, then a number of trenches 102t that may be formed within the semiconductor substrate 102 is reduced and/or the first width w1 is reduced such that the pillar structure 101 is too thin and may collapse due to force applied by layers of the trench capacitor 106. In some embodiments, a trench pitch of the trench 102t is equal to the sum of the first width w1 of the pillar structure 101 and the first length L1 of the trench 102t (e.g., w1+L1). In some embodiments, the trench pitch is within a range of about 0.4 to 0.6 micrometers. In further embodiments, if the trench pitch is less than about 0.4 micrometers, then the opening of the trench 102t may be too small such that the layers of the trench capacitor may not properly fill the trench 102t. In yet further embodiments, if the trench pitch is greater than about 0.6 micrometers, then a capacitance density of the trench capacitor 106 may be reduced.

A second height h2 of the pillar structure 101 is defined from the front-side surface 102f of the semiconductor substrate 102 to a second point 204. The second point 204 is disposed vertically beneath the first point 202 in a direction away from the front-side surface 102f. In some embodiments, the second height h2 is, for example, about 6 micrometers, or within a range of about 0.595 to 7.65 micrometers. In some embodiments, a width of the pillar structure 101 continuously increases from the first point 202 to the second point 204. A third height h3 of the pillar structure 101 is defined from the front-side surface 102f of the semiconductor substrate 102 to a third point 206. The third point 206 may be aligned with a lower surface 102ls of the semiconductor substrate 102. In some embodiments, the lower surface 102ls of the semiconductor substrate 102 defines a bottom surface of the trench 102t and/or is aligned with a bottom surface of the trench segments 106ts. In some embodiments, the third height h3 may be about 7 micrometers, about 8.5 micrometers, or within a range of about 6.5 to 8.5 micrometers. A second length L2 of the trench 102t is aligned with the second point 204. In some embodiments, the second length L2 is within a range of about 0.21 to 0.36 micrometers. In further embodiments, the second length L2 is within a range of about 70 to 90 percent of the first length L1 (e.g., within a range of about 0.7*L1 to 0.9*L1). A third length L3 of the trench 102t is aligned with the third point 206 and/or is aligned with the lower surface 102ls of the semiconductor substrate 102. In some embodiments, the third length L3 is within a range of about 0.3 to 0.4 micrometers or within a range of about 0.24 to 0.4 micrometers. In further embodiments, the third length L3 is within a range of about 80 to 100 percent of the first length L1 (e.g., within a range of about 0.8*L1 to L1). Thus, in some embodiments, the third length L3 is substantially equal to the first length L1. In some embodiments, if the third length L3 is less than about 0.8*L1, then a size of the cavity 103 is reduced which may increase an amount of stress induced on the semiconductor substrate 102. In further embodiments, if the third length L3 is greater than the first length L1, then the layers of the trench capacitor 106 may not be properly disposed along a corner of the trench 102t. This, in part, may result in delamination between the capacitor dielectric layers 112a-d and/or the capacitor electrode layers 110a-d.

Figure 3:
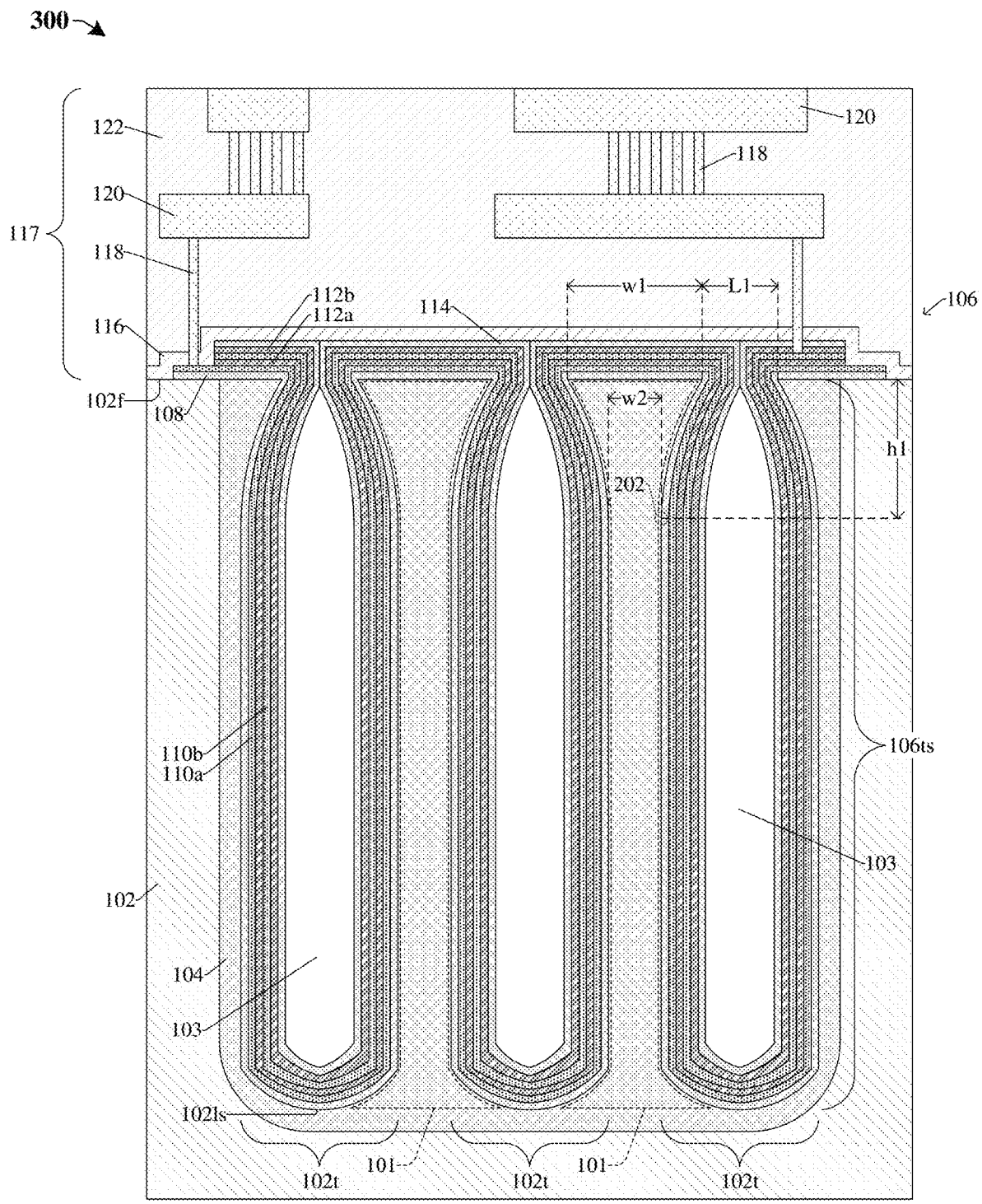

FIG. 3 illustrates a cross-sectional view of some embodiments of an IC 300 that includes a trench capacitor 106 disposed within a semiconductor substrate 102.

The IC 300 includes an interconnect structure 117 overlying a front-side surface 102f of the semiconductor substrate 102. The semiconductor substrate 102 comprises sidewalls defining trenches 102t. Further, the semiconductor substrate 102 comprises pillar structures 101 disposed between the trenches 102t. The pillar structure 101 has a first width w1 aligned with a front-side surface 102f of the semiconductor substrate 102 and a second width w2 disposed at a first point 202. The first point 202 is vertically offset from the front-side surface 102f by a non-zero distance in a direction away from the front-side surface 102f. In some embodiments, the pillar structure 101 has a curved sidewall segment that continuously extends from the front-side surface 102f to the first point 202. In further embodiments, a width of the pillar structure 101 continuously decreases from the front-side surface 102f to the first point 202. In some embodiments, the capacitor dielectric layers 112a-b and the capacitor electrode layers 110a-b conform to the curved sidewall segment of the pillar structure 101. In yet further embodiments, a lower surface 102ls of the semiconductor substrate 102 that defines the bottom surface of trench 102t is curved.

Figure 4:
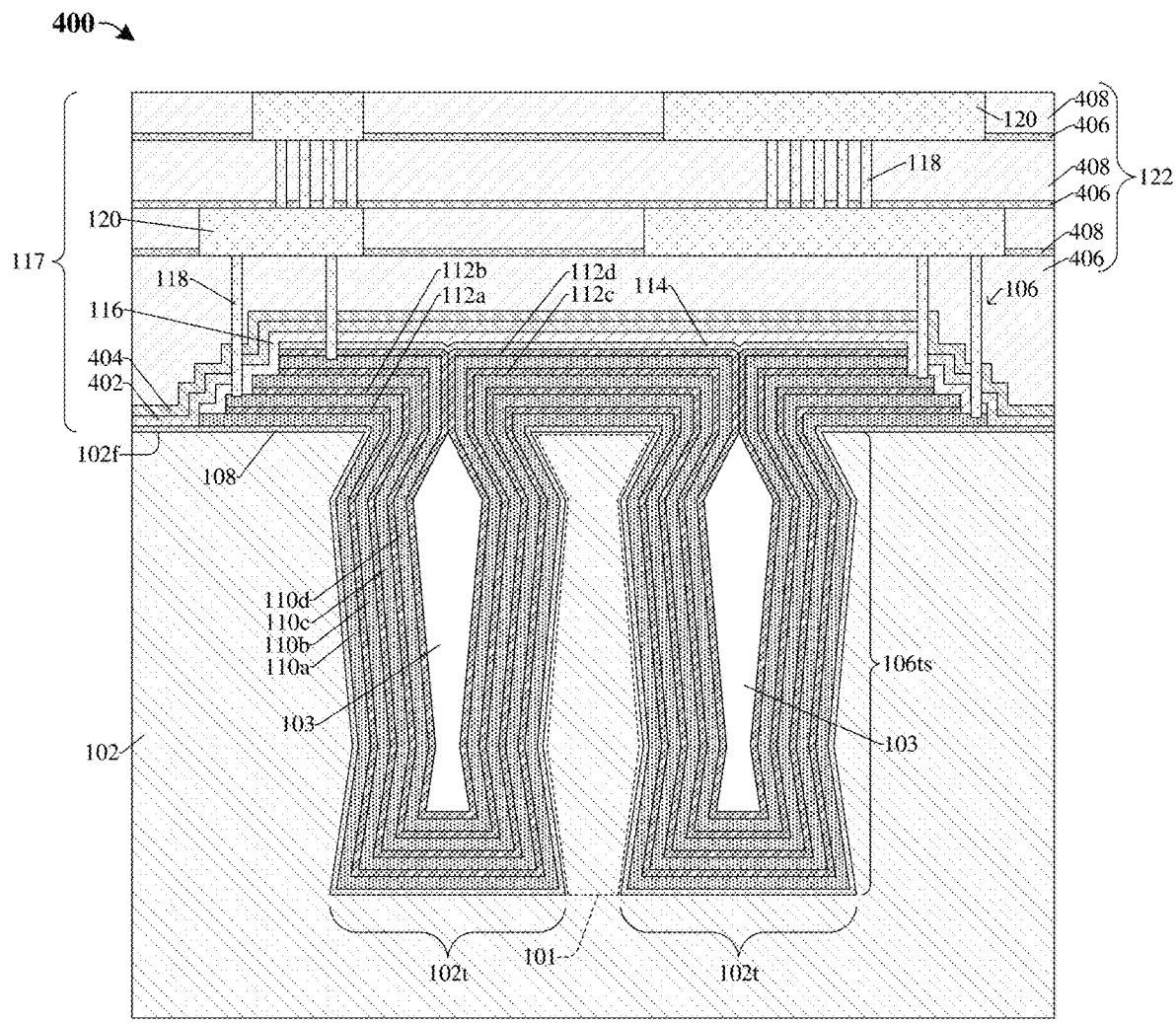

FIG. 4 illustrates a cross-sectional view of some embodiments of an IC 400 according to some alternative embodiments of the IC 200 of FIG. 2.

A first dielectric layer 402 extends over an upper surface of the trench capacitor 106 and the etch stop layer 116. A second dielectric layer 404 overlies the first dielectric layer 402. In some embodiments, the first dielectric layer 402 and/or the second dielectric layer 404 may, for example, respectively be or comprise an oxide, such as silicon dioxide, undoped silicon glass, any combination of the foregoing, or another suitable dielectric material. In some embodiments, the interconnect dielectric structure 122 includes a plurality of inter-level dielectric (ILD) layers 406 and a plurality of dielectric protection layers 408. The dielectric protection layers 408 are alternatingly stacked between adjacent layers of the ILD layers 406. In further embodiments, the ILD layers 406 may, for example, each be or comprise silicon dioxide, a low-k dielectric material, an extreme low-k dielectric material, any combination of the foregoing, or another suitable dielectric material. In yet further embodiments, the dielectric protection layers 408 may, for example, each be or comprise silicon nitride, silicon carbide, silicon oxynitride, or another suitable dielectric material and/or may be configured as an etch stop layer while forming the interconnect structure 117.

Figure 5:
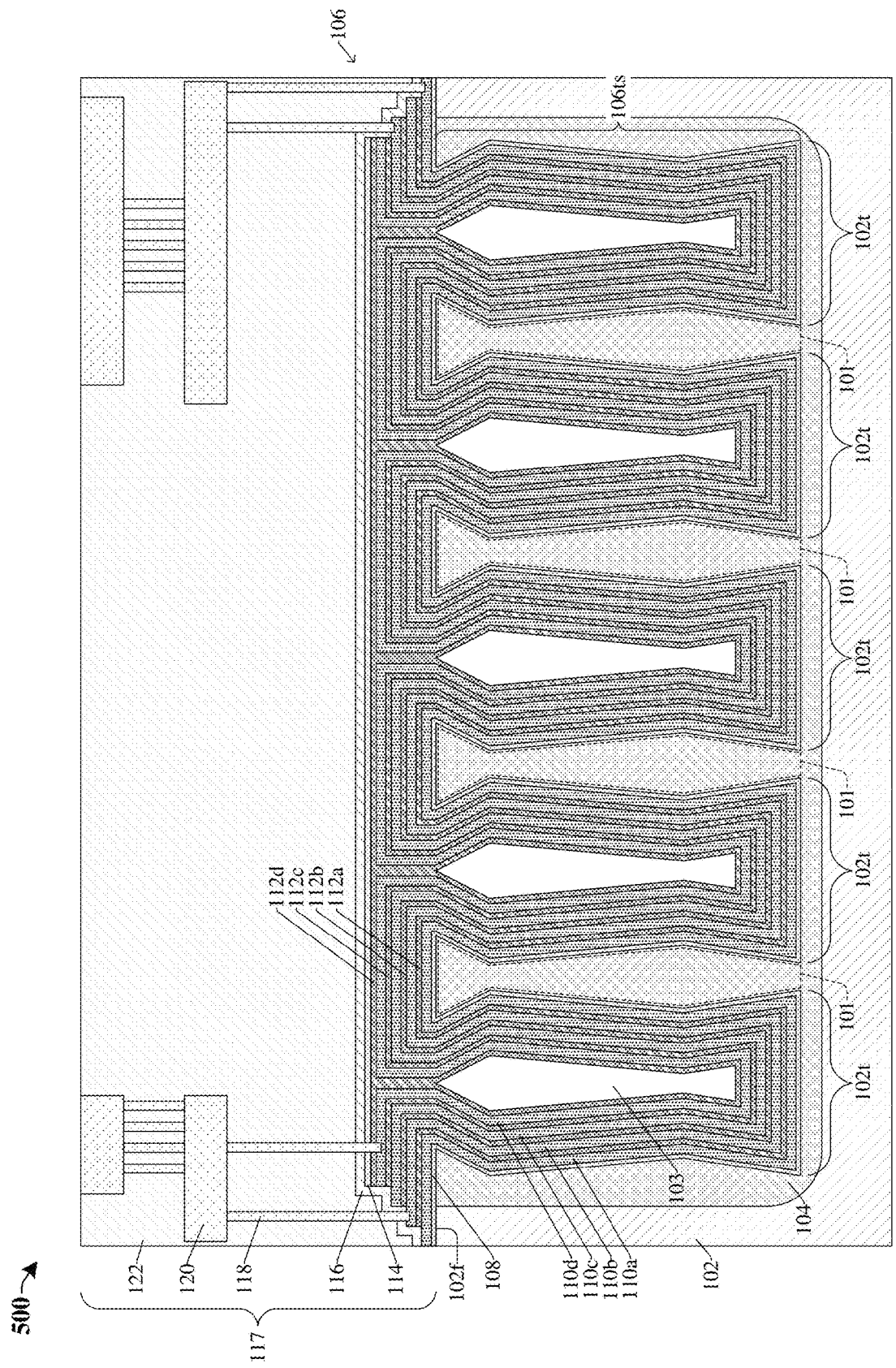
FIGS. 5, 6A, and 6B illustrate cross-sectional views of some embodiments of an IC including a plurality of pillar structures disposed within a substrate and a trench capacitor abutting each pillar structure.

FIG. 5 illustrates a cross-sectional view of some embodiments of an IC 500 corresponding to some alternative embodiments of the IC 200 of FIG. 2.

As illustrated in FIG. 5, the semiconductor substrate 102 comprises a plurality of five trenches 102t, in which the trench capacitor 106 comprises a plurality of five trench segments 106ts that fills a corresponding trench 102t. It will be appreciated that FIG. 5 is merely an example such that the semiconductor substrate 102 may comprise any number of trenches 102t. By increasing a number of trenches 102t disposed within the semiconductor substrate 102 the capacitor density of the trench capacitor 106 is increased.

Figure 6A:
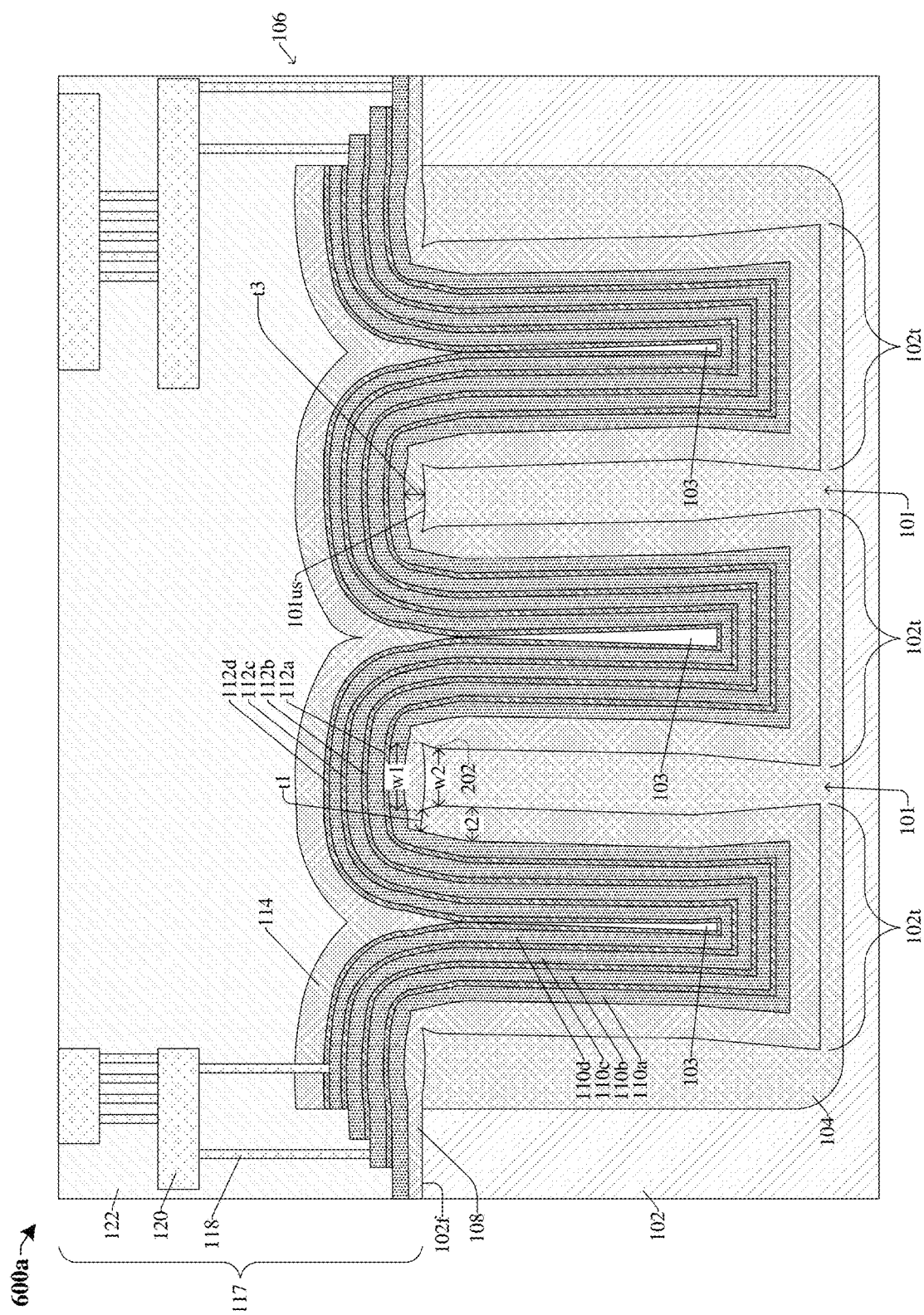

FIG. 6A illustrates a cross-sectional view of some embodiments of an IC 600a corresponding to some alternative embodiments of the IC 200 of FIG. 2.

As illustrated in FIG. 6A, the insulator layer 108 continuously extends along the front-side surface 102f of the semiconductor substrate 102 and along sidewalls of the semiconductor substrate 102 that define the trenches 102t. Thus, the insulator layer 108 is disposed between the trench capacitor 106 and the semiconductor substrate 102, and may be configured to electrically isolate the trench capacitor 106 from other devices disposed within and/or over the semiconductor substrate 102. Further, the insulator layer 108 continuously extends along sidewalls and an upper surface of each pillar structure 101. A first width w1 of the pillar structure 101 is aligned with the front-side surface 102f of the semiconductor substrate 102 and is greater than a second width w2 of the pillar structure 101. The second width w2 is aligned with a first point 202 that is disposed vertically beneath the front-side surface 102f. In some embodiments, the width of the pillar structure 101 continuously decreases from the front-side surface 102f to the first point 202. Further, by virtue of the profile of the pillar structure 101, a first thickness t1 of the insulator layer 108 is less than a second thickness t2 of the insulator layer 108. In further embodiments, the first thickness t1 may, for example, be about 250 Angstroms, or within a range of about 250 to 500 Angstroms. In some embodiments, the second thickness t2 is disposed beneath the first point 202 and may, for example, be about 450 Angstroms, or within a range of about 450 to 900 Angstroms. In further embodiments, the thickness of the insulator layer 108 may continuously increase from the front-side surface 102f of the semiconductor substrate 102 to the first point 202. This, in part, facilitates formation of the cavity 103 within each trench 102t, such that the cavity 103 abuts layers of the trench capacitor 106. In some embodiments, an upper surface 101us of the pillar structure 101 is curved. In further embodiments, a third thickness t3 of the insulator layer 108 is disposed along the upper surface 101us of the pillar structure 101. In some embodiments, the third thickness t3 is less than the second thickness t2.

Figure 6B:
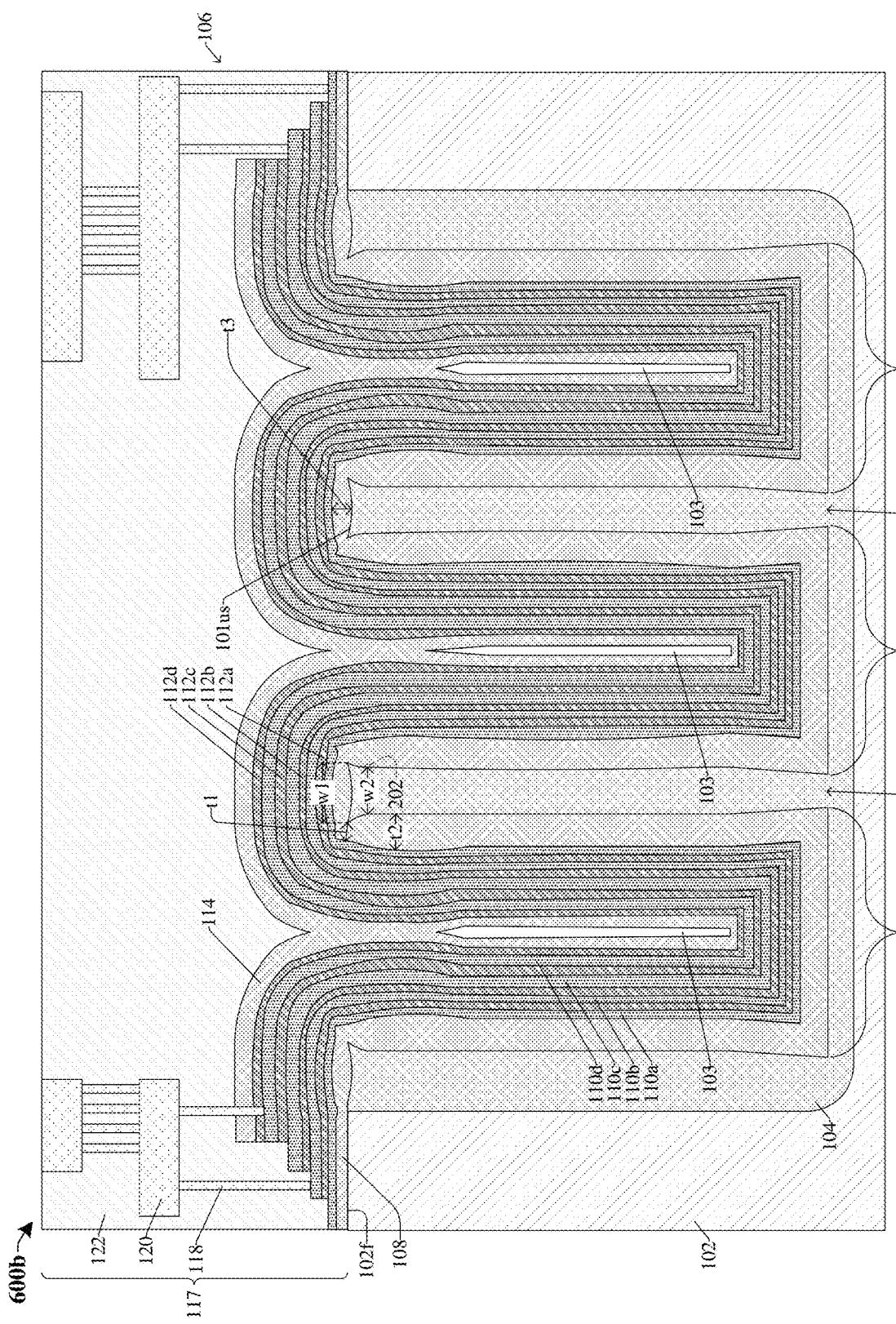

FIG. 6B illustrates a cross-sectional view of some embodiments of an IC 600b corresponding to some alternative embodiments of the IC 600a of FIG. 6A.

As illustrated in FIG. 6B, the capping dielectric layer 114 continuously extends along an upper surface of an uppermost capacitor dielectric layer 112d. Thus, in some embodiments, the capping dielectric layer 114 may seal each cavity 103 within a corresponding trench 102t to a first gas pressure such that the cavity 103 is defined between inner sidewalls of the capping dielectric layer 114.

FIGS. 7-14 illustrate cross-sectional views 700-1400 of some embodiments of a method of forming an integrated circuit (IC) with a trench capacitor disposed in a trench and having sidewalls defining a cavity according to the present disclosure. Although the cross-sectional views 700-1400 shown in FIGS. 7-14 are described with reference to a method, it will be appreciated that the structures shown in FIGS. 7-14 are not limited to the method but rather may stand alone separate of the method. Furthermore, although FIGS. 7-14 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

As shown in cross-sectional view 700 of FIG. 7, a semiconductor substrate 102 is provided and is subsequently patterned to define at least a portion of trenches 102t and a pillar structure 101 within the semiconductor substrate 102. In some embodiments, the semiconductor substrate 102 may, for example, be or comprise a bulk substrate (e.g., a bulk silicon substrate), a silicon-on-insulator (SOI) substrate, or another suitable substrate material. Before performing the patterning process, a masking layer stack 702 is formed over the front-side surface 102f of the semiconductor substrate 102. In some embodiments, the masking layer stack 702 includes a first hard mask layer 704, a second hard mask layer 706, an upper dielectric layer 708, an anti-reflection coating (ARC) layer 710, and a photoresist 712. In some embodiments, the first hard mask layer 704 may be deposited (e.g., by chemical vapor deposition (CVD), physical vapor deposition (PVD), atomic layer deposition (ALD), etc.) along the front-side surface 102f of the semiconductor substrate 102. Subsequently, after depositing the first hard mask layer 704, an ion implantation process may be performed on the semiconductor substrate 102, through the first hard mask layer 704, such that the semiconductor substrate 102 comprises a first doping type (e.g., p-type). In yet further embodiments, another ion implantation process may be performed to define other doped regions (not shown) (e.g., the doped region 104 of FIG. 1) within the semiconductor substrate 102. After performing the ion implantation process, the second hard mask layer 706, the upper dielectric layer 708, the ARC layer 710, and the photoresist 712 are deposited (e.g., respectively by CVD, PVD, ALD, etc.) over the first hard mask layer 704. In some embodiments, the pillar structure 101 may, for example, be or comprise silicon, intrinsic silicon, doped silicon, or another suitable material.

Figure 7:
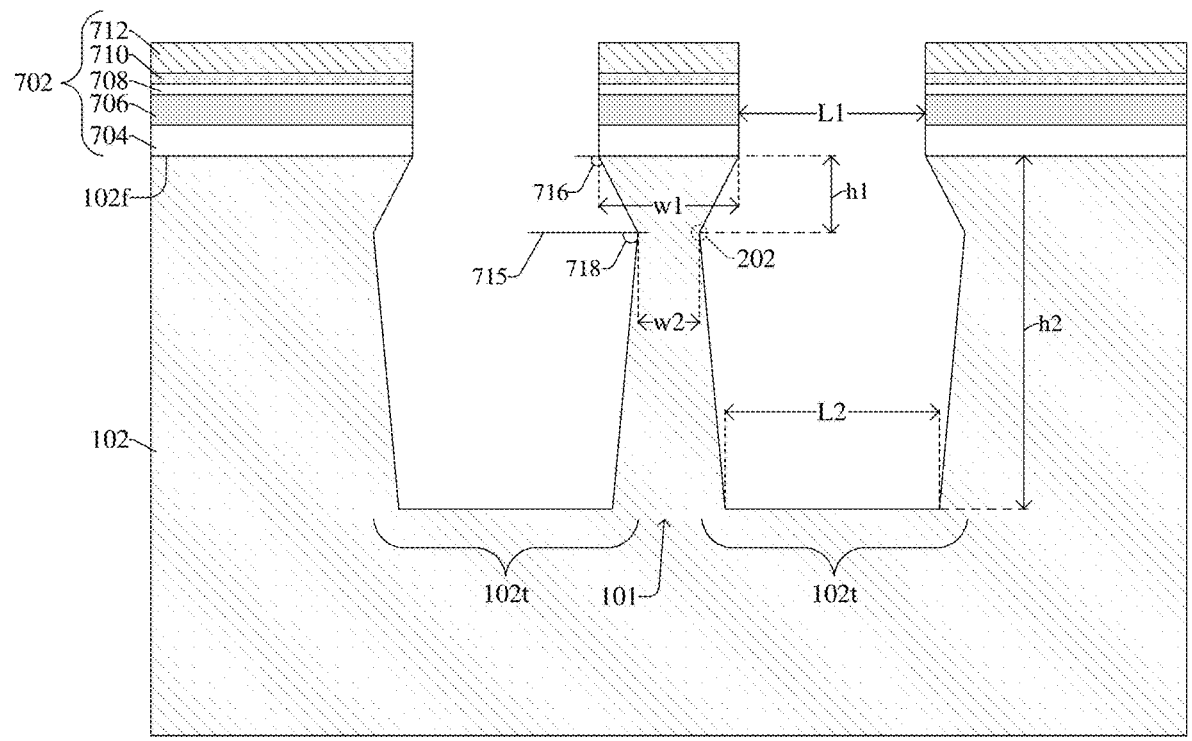
FIGS. 7-14 illustrate cross-sectional views of some embodiments of a method of forming an integrated chip (IC) having a trench capacitor disposed within a trench and laterally adjacent to a cavity within the trench.

Further, as illustrated in FIG. 7, the masking layer stack 702 is patterned to define openings within the masking layer stack 702 and expose the front-side surface 102f of the semiconductor substrate 102. Subsequently, the semiconductor substrate 102 is patterned according to the masking layer stack 702 to define at least a portion of trenches 102t within the semiconductor substrate 102. In some embodiments, the patterning process includes performing one or more dry etch processes. Further, a power, time, pressure, and angle of the one or more dry etch processes are configured to define a first width w1, a second width w2, a first height h1, and a second height h2 of the pillar structure 101. In some embodiments, the first width w1 of the pillar structure 101 is within a range of about 0.1 to 0.2 micrometers. In various embodiments, the second width w2 of the pillar structure 101 is within a range of about 0.07 to 0.17 micrometers. In yet further embodiments, the first height h1 is, for example, greater than 0.05 micrometers or within a range of about 0.05 to 4 micrometers. In some embodiments, the second height h2 is, for example, about 6 micrometers, or within a range of about 0.595 to 7.65 micrometers. In yet further embodiments, the one or more dry etch processes are performed such that a first length L1 and a second length L2 of each trench 102t are define. In some embodiments, the first length L1 of the trench 102t is within a range of about 0.3 to 0.4 micrometers. In some embodiments, the second length L2 is within a range of about 0.21 to 0.36 micrometers. In further embodiments, the second length L2 is within a range of about 70 to 90 percent of the first length L1 (e.g., within a range of about 0.7*L1 to 0.9*L1).

A first angle 716 is defined from a horizontal line aligned with the front-side surface 102f of the semiconductor substrate 102 and a first sidewall of the pillar structure 101. In various embodiments, the first angle 716 is within a range of about 92 to 95 degrees, or another suitable value. A second angle 718 is defined from a horizontal line 715 aligned with a first point 202 and a second sidewall of the pillar structure 101. In some embodiments, the second angle 718 is within a range of about 88 to 90 degrees, or another suitable value. The first point 202 is disposed beneath the front-side surface 102f of the semiconductor substrate 102. In some embodiments, the first height h1 and the second height h2 correspond to heights of the trench 102t.

In some embodiments, the first hard mask layer 704 may, for example, be or comprise an oxide, such as silicon dioxide, or another suitable dielectric material. The second hard mask layer 706 may, for example, be or comprise amorphous carbon or another suitable dielectric material. The upper dielectric layer 708 may, for example, be or comprise silicon oxynitride, silicon oxycarbide, or the like.

Figure 8:
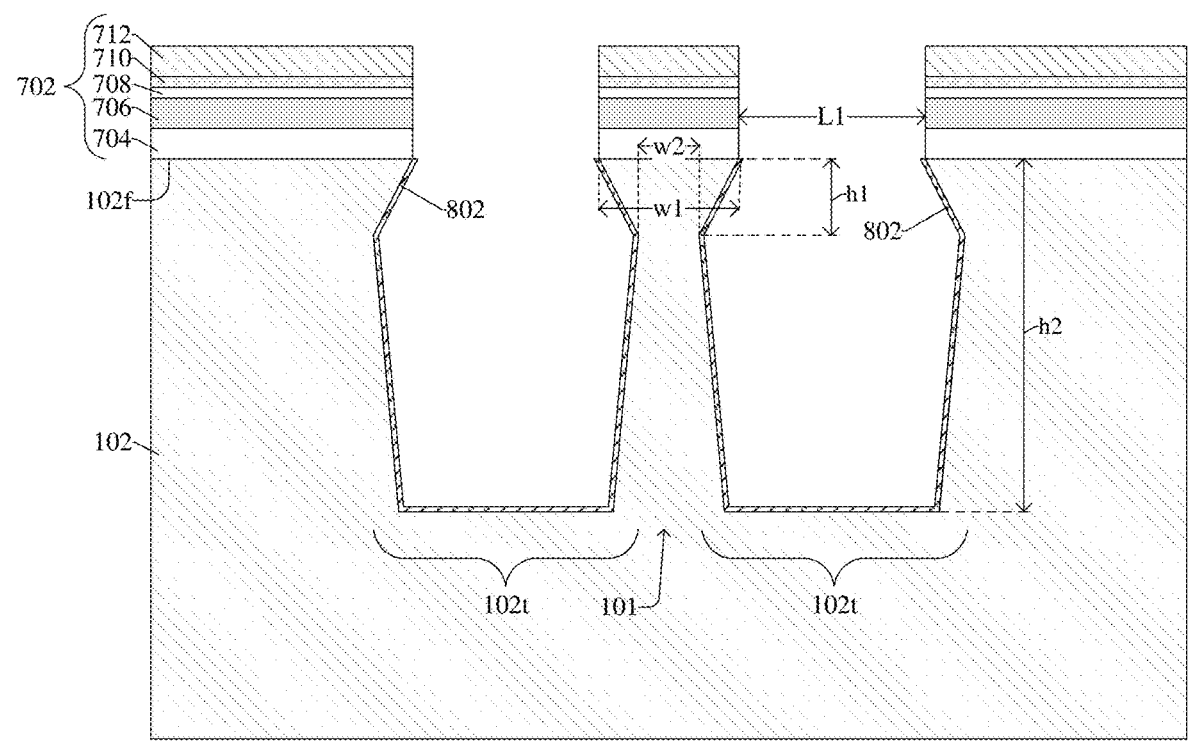

As illustrated in cross-sectional view 800 of FIG. 8, a sidewall protection layer 802 is formed along the sidewalls of the semiconductor substrate 102 that define the trenches 102t. In some embodiments, the sidewall protection layer 802 may, for example, be deposited or grown by thermal oxidation, CVD, PVD, or another suitable deposition or growth process. In further embodiments, the sidewall protection layer 802 may, for example, be or comprise an oxide, such as silicon dioxide, or another suitable dielectric material.

Figure 9:
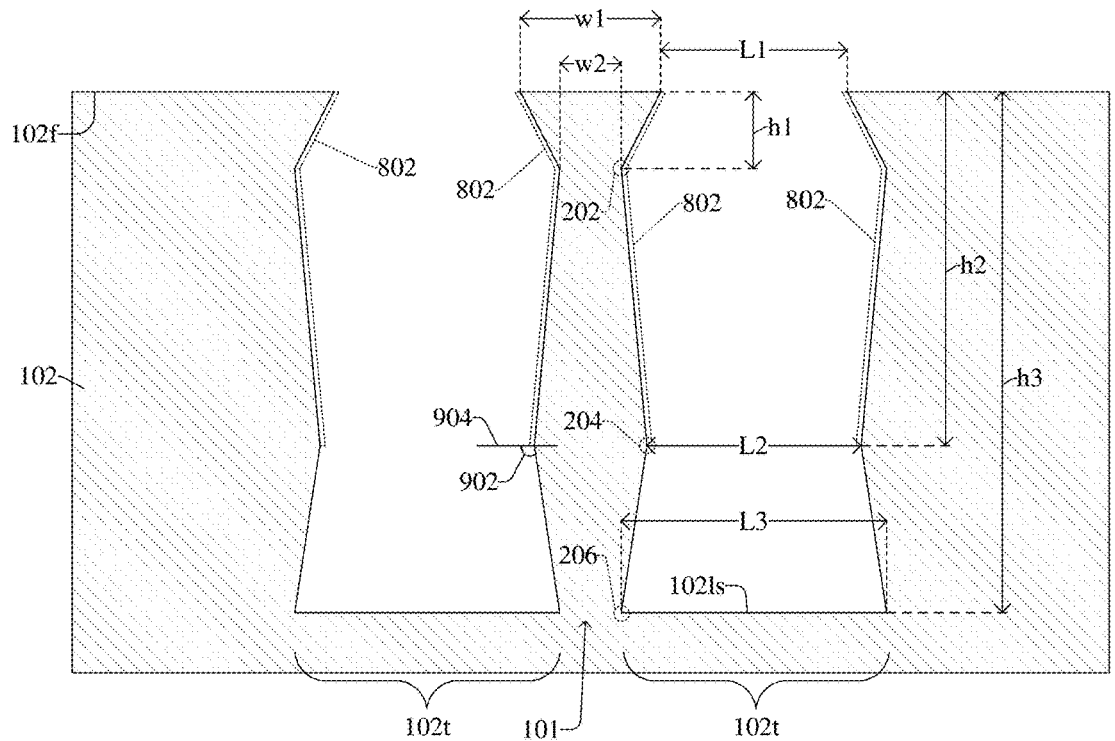

As illustrated in cross-sectional view 900 of FIG. 9, the semiconductor substrate 102 is patterned to expand the trenches 102t and further define the pillar structure 101. In some embodiments, the patterning process may include exposing the semiconductor substrate 102 to one or more etchants according to the masking layer stack (702 of FIG. 8). In further embodiments, the patterning process of FIG. 9 may include performing one or more dry etches at a lower pressure than the one or more dry etches of FIG. 7. Further, after performing the patterning process of FIG. 9, a removal process is performed to remove the masking layer stack (702 of FIG. 8). Further, a power, time, pressure, and angle of the one or more dry etch processes of FIG. 9 are configured to define a third length L3 of the trench 102t and a third height h3 of the pillar structure 101 and/or the trench 102t. In some embodiments, the third length L3 is within a range of about 0.3 to 0.4 micrometers or within a range of about 0.24 to 0.4 micrometers. In further embodiments, the third length L3 is within a range of about 80 to 100 percent of the first length L1 (e.g., within a range of about 0.8*L1 to L1). Thus, in some embodiments, the third length L3 is substantially equal to the first length L1. In further embodiments, the third length L3 is aligned with a lower surface 1021s of the semiconductor substrate 102. In some embodiments, the width of the trench 102t continuously decreases from the second point 204 to the third point 206.

A third angle 902 is defined between a sidewall of the pillar structure 101 and a substantially horizontal line 904. In some embodiments, the substantially horizontal line 904 is horizontally aligned with the second point 204 and is parallel with the front-side surface 102f of the semiconductor substrate 102. In some embodiments, the third angle 902 is within a range of about 90 to 93 degrees. The third height h3 of the pillar structure 101 is defined from the front-side surface 102f of the semiconductor substrate 102 to the third point 206. The third point 206 may be aligned with the lower surface 1021s of the semiconductor substrate 102. In some embodiments, the third height h3 may be about 7 micrometers, about 8.5 micrometers, or within a range of about 6.5 to 8.5 micrometers. In yet further embodiments, after performing the one or more dry etches of FIG. 9, a removal process (e.g., a wet etch) may be performed to remove the sidewall protection layer 802. In further embodiments, the sidewall protection layer 802 may remain in place during the patterning process of FIG. 9, such that the sidewall protection layer 802 may prevent damage to sidewalls of the semiconductor substrate 102 that define an upper portion of the trench 102t and/or the pillar structure 101 (e.g., the region between the front-side surface 102f and the second point 204). This in turn may ensure the dimensions (e.g., w1, w2, L1, h1, h2, and/or L2) defined by the patterning process of FIG. 7 are not substantially changed during the patterning process of FIG. 9. In further embodiments, the patterning processes of FIGS. 7 and 9 are performed such that the trenches 102t respectively have a high aspect ratio (e.g., an aspect ratio greater than about 20:1).

Figure 10:
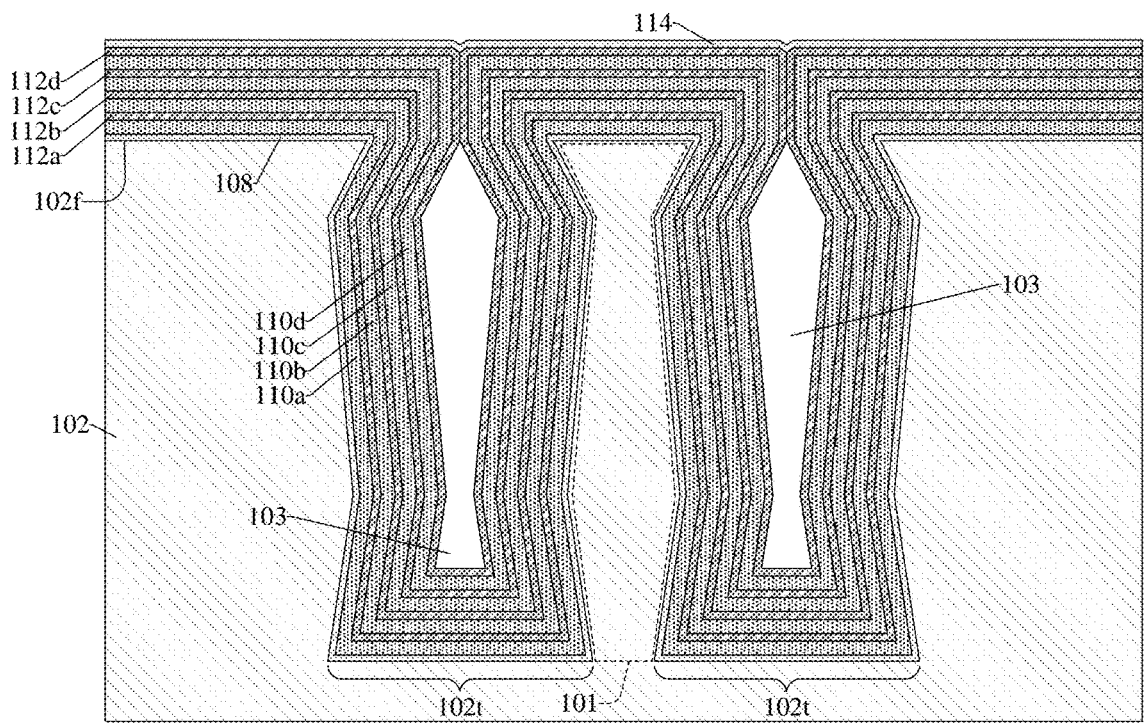

As illustrated in cross-sectional view 1000 of FIG. 10, an insulator layer 108 is formed along the front-side surface 102f of the semiconductor substrate 102 and sidewalls of the semiconductor substrate 102 defining the trenches 102t. In some embodiments, the insulator layer 108 may, for example, be or comprise an oxide, such as silicon dioxide, or another suitable dielectric material and/or may be formed to a thickness greater than 250 Angstroms, or within a range of about 250 to 900 Angstroms, or another suitable value. In further embodiments, the insulator layer 108 may, for example, be deposited by, for example, sputtering, CVD, PVD, thermal oxidation, or another suitable growth or deposition process. In some embodiments, the insulator layer 108 may be formed solely by thermal oxidation. Subsequently, a plurality of capacitor electrode layers 110a-d and a plurality of capacitor dielectric layers 112a-d are formed within the trenches 102t of the semiconductor substrate 102. The aforementioned layers are formed such that they conform to sidewalls of the pillar structure 101 and sidewalls of the semiconductor substrate 102 that define the trenches 102t, thereby defining a cavity 103 within each trench 102t. The cavity 103 is defined between sidewalls of an uppermost capacitor dielectric layer 112d. Further, a capping dielectric layer 114 is formed over the uppermost capacitor dielectric layer 112d. In some embodiments, the capacitor electrode layers 110a-d and the capacitor dielectric layers 112a-d may, for example, respectively be formed by ALD, CVD, PVD, or another suitable deposition or growth process. In further embodiments, the aforementioned layers may be solely deposited by ALD, such that an ALD process may performed to deposit each layer. In further embodiments, the capping dielectric layer 114 may, for example, be formed by ALD, CVD, or another suitable deposition or growth process.

During subsequent processing steps, the capacitor electrode layers 110a-d and/or capacitor dielectric layers 112a-d may be exposed to high heat (e.g., by thermal annealing process(es)). The high heat may result in thermal expansion of the capacitor electrode layers 110a-d and capacitor dielectric layers 112a-d such that the aforementioned layers may expand into the cavity 103. This, in part, mitigates force applied to the semiconductor substrate 102 and/or pillar structure 101 when the capacitor electrode layers 110a-d and the capacitor dielectric layers 112a-d expand. Therefore, cracking, warping, and/or breaking of the semiconductor substrate 102 and/or the pillar structure 101 may be reduced.

In further embodiments, the capping dielectric layer 114 is formed such that it extends within each trench 102t thereby sealing the cavities 103 with a first gas pressure, respectively, for example, see FIGS. 2 and 6B. Thus, the capping dielectric layer 114 may continuously extend along an upper surface of an uppermost capacitor dielectric layer 112d. In such embodiments, each cavity 103 is defined between inner sidewalls of the capping dielectric layer 114.

Figure 11:
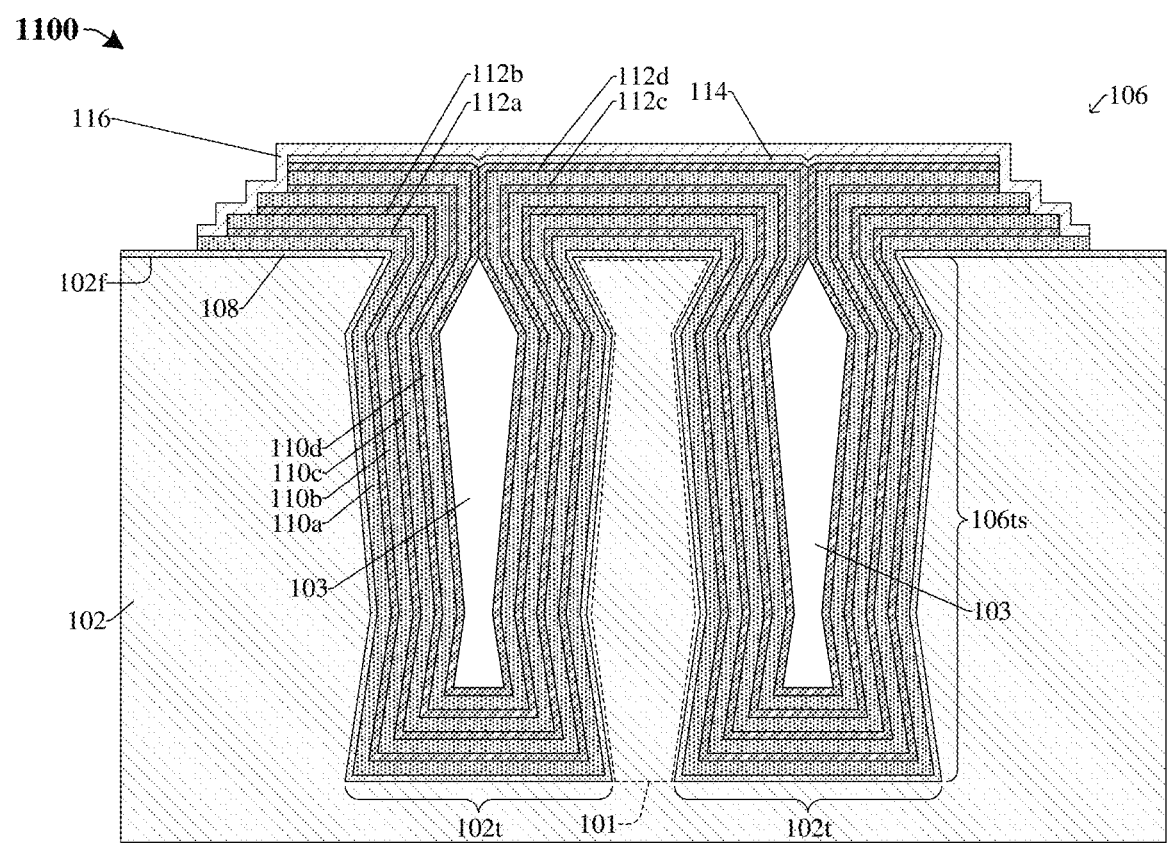

As illustrated in cross-sectional view 1100 of FIG. 11, the capacitor electrode layers 110a-d and/or capacitor dielectric layers 112a-d are patterned, thereby defining a trench capacitor 106. In some embodiments, a process for patterning each capacitor electrode layer 110a-d and/or capacitor dielectric layer 112a-d includes: forming a masking layer (not shown) over the target capacitor electrode layer and/or capacitor dielectric layer; exposing unmasked regions of the target capacitor electrode layer and/or capacitor dielectric layer to one or more etchants, thereby reducing a width of the target layer(s); and performing a removal process (e.g., a wet etch process) to remove the masking layer. For example, a first patterning process according to a first masking layer (not shown) may be performed on a first capacitor electrode layer 110a, a second patterning process according to a second masking layer (not shown) may be performed on a second capacitor electrode layer 110b and a first capacitor dielectric layer 112a, and additional patterning processes may be performed for the remaining capacitor layers. Further, an etch stop layer 116 is formed over an upper surface of the trench capacitor 106. In some embodiments, the etch stop layer 116 may be deposited by CVD, PVD, ALD, or another suitable growth or deposition process. In some embodiments, the etch stop layer 116 may, for example, be or comprise silicon nitride, silicon carbide, or another suitable dielectric material.

Figure 12:
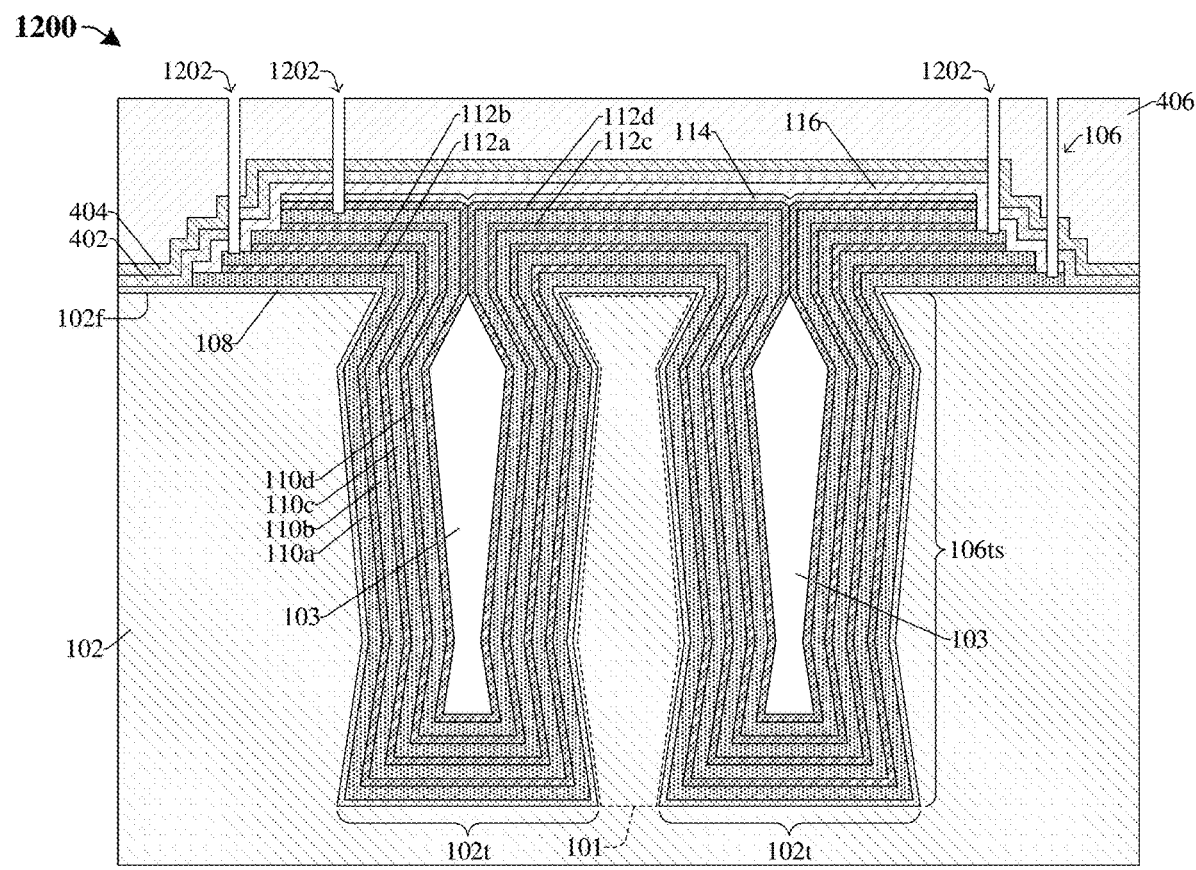

As illustrated in cross-sectional view 1200 of FIG. 12, a first dielectric layer 402 is formed over the semiconductor substrate 102 and a second dielectric layer 404 is formed over the first dielectric layer 402. In some embodiments, the first dielectric layer 402 and/or the second dielectric layer 404 may, for example, respectively be or comprise an oxide, such as silicon dioxide, undoped silicon glass, any combination of the foregoing, or another suitable dielectric material. Further, an inter-level dielectric (ILD) layer 406 is formed over the second dielectric layer 404. In some embodiments, the ILD layer 406, the first dielectric layer 402, and the second dielectric layer 404 may, for example, respectively be formed by CVD, PVD, thermal oxidation, or another suitable deposition or growth process. In some embodiments, the ILD layer 406 may, for example, be or comprise silicon dioxide, a low-k dielectric material, an extreme low-k dielectric material, or another suitable dielectric material. In addition, the ILD layer 406, the first dielectric layer 402, and the second dielectric layer 404 are patterned to define a plurality of contact openings 1202 over the trench capacitor 106 and expose an upper surface of each of the capacitor electrode layers 110a-d.

Figure 13:
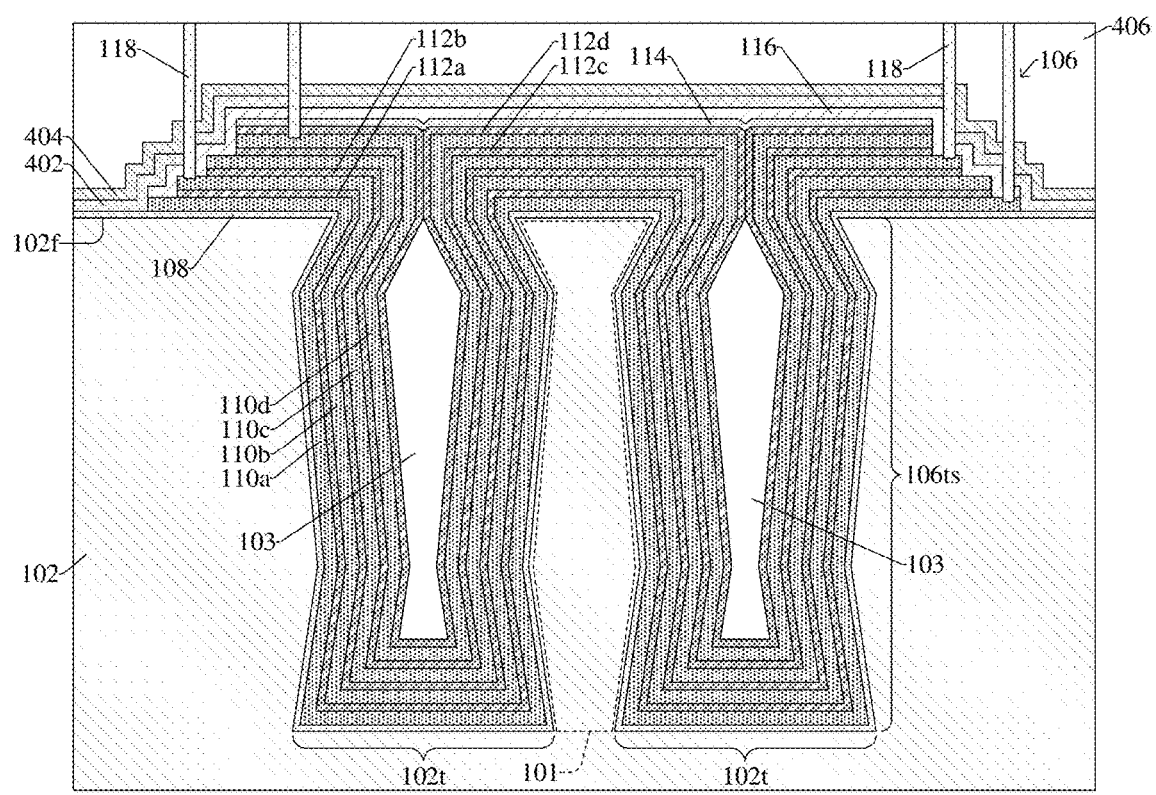

As illustrated in cross-sectional view 1300 of FIG. 13, conductive vias 118 are formed over the capacitor electrode layers 110a-d. In some embodiments, a process for forming the conductive vias 118 may include: depositing (e.g., by CVD, PVD, sputtering, electroplating, electroless plating, etc.) a conductive material (e.g., copper, aluminum, tungsten, titanium nitride, tantalum nitride, etc.) over the semiconductor substrate 102, thereby filling the contact openings (1202 of FIG. 12); and performing a planarization process (e.g., a chemical mechanical planarization (CMP) process) into the conductive material until an upper surface of the ILD layer 406 is reached, thereby defining the conductive vias 118.

Figure 14:
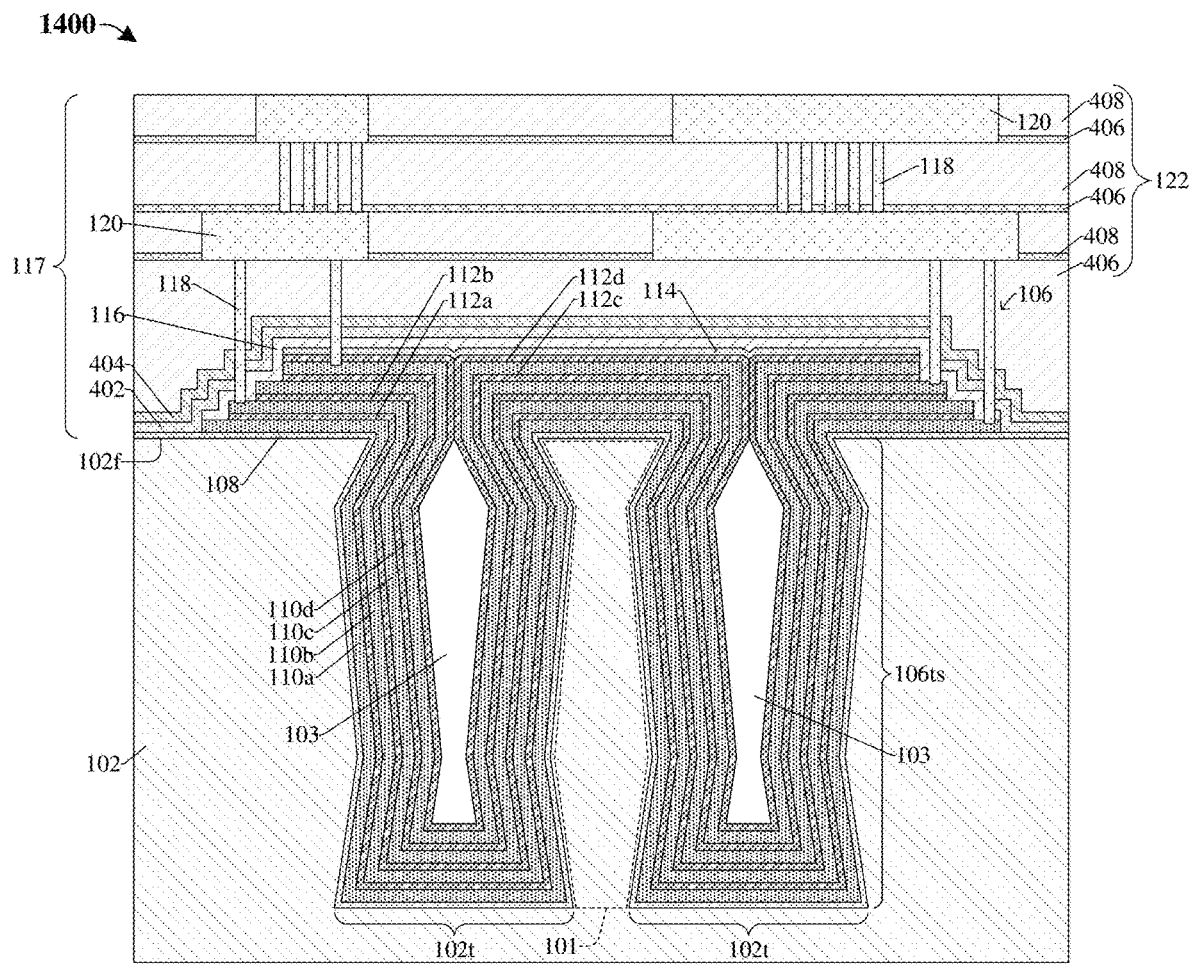

As illustrated by cross-sectional view 1400 of FIG. 14, remaining layers of an interconnect structure 117 are formed over the trench capacitor 106. The interconnect structure 117 includes an interconnect dielectric structure 122, a plurality of conductive wires 120, and the plurality of conductive vias 118. In some embodiments, the interconnect structure 117 includes ILD layers 406 and a plurality of dielectric protection layers 408. In some embodiments, the ILD layers 406 and/or the dielectric protection layers 408 may, for example, respectively be deposited by CVD, PVD, thermal oxidation, or another suitable deposition or growth process. Further, the conductive wires 120 and/or the conductive vias 118 may be formed by a single damascene process or a dual damascene process. In yet further embodiments, the conductive wires 120 may, for example, be or comprise tungsten, copper, aluminum, titanium nitride, tantalum nitride, or another suitable conductive material.

Figure 15:
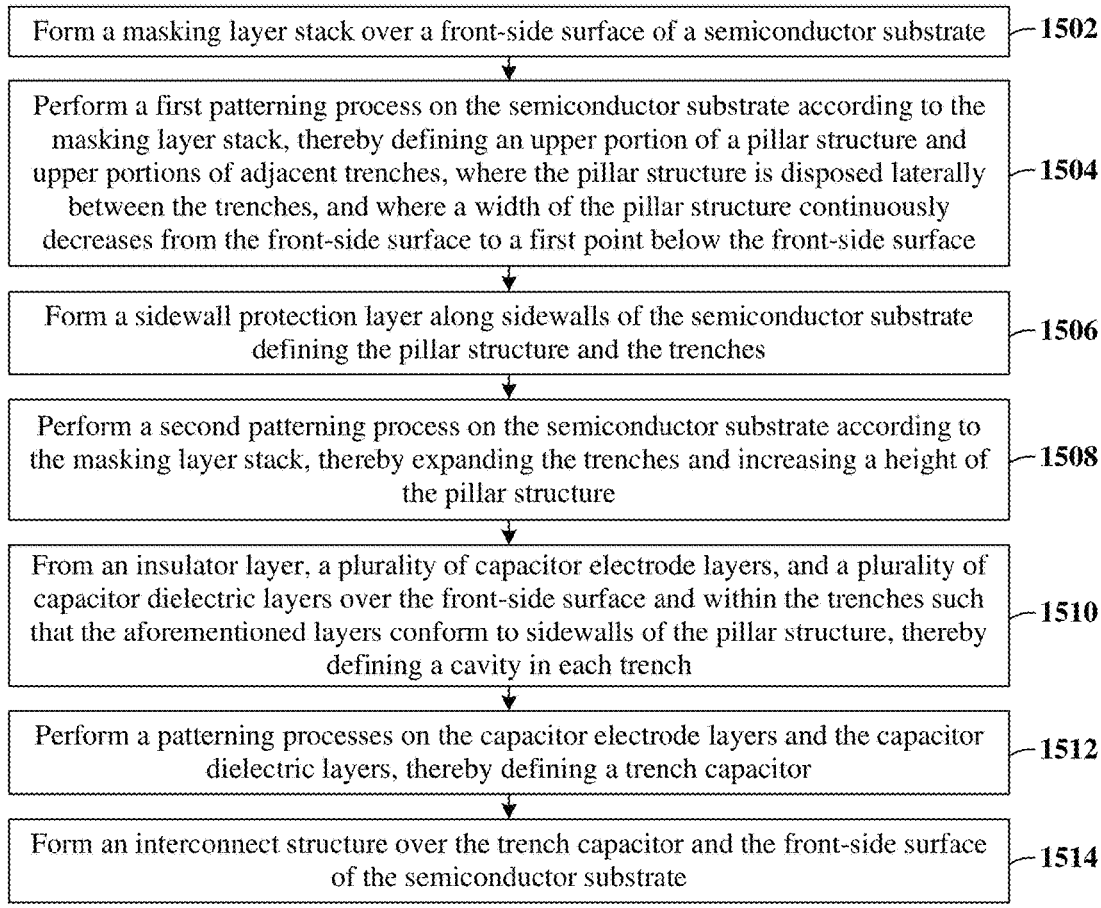
FIG. 15 illustrates a flowchart of some embodiments of a method for forming an IC having a trench capacitor disposed within a trench and laterally adjacent to a cavity within the trench.

FIG. 15 illustrates a method 1500 of forming an integrated circuit (IC) including a trench capacitor disposed within a trench and laterally adjacent to a cavity within the trench according to the present disclosure. Although the method 1500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1502, a masking layer stack is formed over the front-side surface of a semiconductor substrate. FIG. 7 illustrates a cross-sectional view 700 of some embodiments corresponding to act 1502.

At act 1504, a first patterning process is performed on the semiconductor substrate according to the masking layer stack, thereby defining an upper portion of a pillar structure and upper portions of adjacent trenches. The pillar structure is disposed laterally between the trenches. Further, a width of the pillar structure continuously decreases from the front-side surface of the semiconductor substrate to a first point that is disposed below the front-side surface. FIG. 7 illustrates a cross-sectional view 700 of some embodiments corresponding to act 1504.

At act 1506, a sidewall protection layer is formed along sidewalls of the semiconductor substrate defining the pillar structure and the trenches. FIG. 8 illustrates a cross-sectional view 800 of some embodiments corresponding to act 1506.

At act 1508, a second patterning process is performed on the semiconductor substrate according to the masking layer stack, thereby expanding the trenches and increasing a height of the pillar structure. FIG. 9 illustrates a cross-sectional view 900 of some embodiments corresponding to act 1508.

At act 1510, an insulator layer, a plurality of capacitor electrode layers, and a plurality of capacitor dielectric layers are formed over the front-side surface of the semiconductor substrate and within the trenches. Thus, the aforementioned layers conform to sidewalls of the pillar structure, thereby defining a cavity in each trench. FIG. 10 illustrates a cross-sectional view 1000 of some embodiments corresponding to act 1510.

At act 1512, patterning processes are performed on the capacitor electrode layers and the capacitor dielectric layers, thereby defining a trench capacitor. FIG. 11 illustrates a cross-sectional view 1100 of some embodiments corresponding to act 1512.

At act 1514, an interconnect structure is formed over the trench capacitor and the front-side surface of the semiconductor substrate. FIGS. 12-14 illustrate cross-sectional views 1200-1400 of some embodiments corresponding to act 1514.

Accordingly, in some embodiments, the present disclosure relates to an integrated circuit (IC) comprising a pillar structure disposed within a substrate and having a width that continuously decreases from a front-side surface of the substrate to a point below the front-side surface. A trench capacitor includes first and second trench segments recessed into the substrate and defining a first cavity and a second cavity disposed on opposing sides of the pillar structure.

In some embodiments, the present application provides an integrated circuit (IC) including a substrate having sidewalls that define a trench, wherein the trench extends into a front-side surface of the substrate; a trench capacitor including a plurality of capacitor electrode layers and a plurality of capacitor dielectric layers that respectively line the trench and define a cavity within the substrate; and a pillar structure disposed within the substrate and abutting the trench, wherein the pillar structure has a first width and a second width less than the first width, wherein the first width is aligned with the front-side surface of the substrate and the second width is aligned with a first point disposed beneath the front-side surface.

In some embodiments, the present application provides a semiconductor structure including a substrate; a trench capacitor including a plurality of capacitor electrode layers and a plurality of capacitor dielectric layers overlying a front-side surface of the substrate, wherein the capacitor electrode layers and the capacitor dielectric layers define a first trench segment and a second trench segment protruding into the substrate and further define a first cavity and a second cavity recessed into the substrate respectively at the first and second trench segments; and a pillar structure disposed laterally between the first trench segment and the second trench segment, wherein a width of the pillar structure continuously decreases in a first direction from the front-side surface towards a bottom surface of the first and second trench segments.

In some embodiments, the present application provides a method for forming a trench capacitor, the method including performing a first patterning process on a front-side surface of a substrate to define an upper portion of a trench and an upper portion of a pillar structure, wherein the first patterning process is performed such that a width of the pillar structure decreases from the front-side surface to a first point below the front-side surface; performing a second patterning process on the substrate to expand the trench and increase a height of the pillar structure; and forming a plurality of capacitor dielectric layers and a plurality of capacitor electrode layers within the trench such that a cavity is defined between sidewalls of an uppermost capacitor dielectric layer, wherein the cavity is disposed within the trench, and wherein the uppermost capacitor dielectric layer seals the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a capacitor overlying a substrate and comprising a plurality of conductive layers and a plurality of dielectric layers, wherein the plurality of conductive layers and the plurality of dielectric layers define a base structure and a first protrusion structure extending downward from the base structure towards a bottom surface of the substrate, wherein the first protrusion structure comprises one or more surfaces defining a first cavity, wherein a top of the first cavity is disposed below the base structure; and
an insulator layer disposed along a bottom surface of the base structure and along opposing sidewalls of the first protrusion structure, wherein a first thickness of the insulator layer along a first sidewall of the opposing sidewalls of the first protrusion structure is greater than a thickness of an individual conductive layer in the plurality of conductive layers.

2. The integrated chip of claim 1, wherein an upper dielectric layer overlies the capacitor, wherein the first cavity is sealed by at least one of the conductive layers, the dielectric layers, or the upper dielectric layer.

3. The integrated chip of claim 1, wherein the first protrusion structure comprises a first protrusion segment overlying a second protrusion segment, wherein a size of the first protrusion segment continuously increases from the base structure in a first direction towards the bottom surface of the substrate.

4. The integrated chip of claim 3, wherein a height of the first protrusion segment is less than a height of the second protrusion segment.

5. The integrated chip of claim 3, wherein the first protrusion structure comprises a third protrusion segment under the second protrusion segment, wherein a size of the third protrusion segment continuously decreases from the second protrusion segment in the first direction.

6. The integrated chip of claim 1, wherein the plurality of conductive layers and the plurality of dielectric layers further define a second protrusion structure extending downward from the base structure and laterally adjacent to the first protrusion structure, wherein the second protrusion structure comprises one or more surfaces defining a second cavity having a smaller size than the first cavity.

7. The integrated chip of claim 1, wherein the first thickness is greater than a width of the first cavity.

8. The integrated chip of claim 1, wherein a second thickness of the insulator layer along the bottom surface of the base structure is less than the first thickness.

9. The integrated chip of claim 1, wherein a dielectric material of the insulator layer is different from that of the plurality of dielectric layers.

10. An integrated chip, comprising:
a capacitor overlying a substrate, wherein the capacitor comprises a base structure, a first protrusion structure, and a second protrusion structure, wherein the first and second protrusion structures underlie the base structure and are disposed in the substrate; and
a column structure in the substrate, wherein the column structure is disposed directly between the first and second protrusion structures, wherein the column structure comprises a first tapered segment overlying an elongated vertical segment.

11. The integrated chip of claim 10, wherein a height of the first tapered segment is less than a height of the elongated vertical segment.

12. The integrated chip of claim 10, wherein the column structure comprises a second tapered segment underlying the elongated vertical segment.

13. The integrated chip of claim 12, wherein the first tapered segment comprises curved sidewalls and the second tapered segment comprises slanted straight sidewalls.

14. The integrated chip of claim 10, further comprising:

an upper dielectric layer over the capacitor and disposed along upper sidewalls of the first and second protrusion structures, wherein a bottom surface of the upper dielectric layer is disposed below a top surface of the first tapered segment, wherein a first thickness of the upper dielectric layer over the base structure is greater than a second thickness of the upper dielectric layer below the top surface of the first tapered segment.

15. The integrated chip of claim 10, further comprising:

an insulator layer disposed between the column structure and the capacitor, wherein a thickness of the insulator layer along a sidewall of the first tapered segment continuously increases in a direction from a top surface of the first tapered segment towards a bottom of the column structure.

16. A method for forming an integrated chip, comprising:

forming a column structure over a base region of a substrate, wherein the column structure comprises a first tapered segment overlying an elongated vertical segment; and forming a capacitor adjacent to the column structure, wherein the capacitor comprises a protrusion structure arranged in the substrate and abutting the column structure.

17. The method of claim 16, wherein the column structure further comprises a second tapered segment under the elongated vertical segment, wherein a height of the first tapered segment is less than a height of the second tapered segment.

18. The method of claim 17, wherein forming the column structure comprises:

performing a first etch process to form the first tapered segment and the elongated vertical segment; and performing a second etch process to form the second tapered segment, wherein the first etch process is different from the second etch process.

19. The method of claim 16, wherein a maximum width of the column structure is less than a maximum width of the protrusion structure.

20. The method of claim 16, wherein one or more surfaces of the protrusion structure define a cavity, wherein a top of the cavity is aligned with or disposed below a top surface of the column structure.

* * * * *